(12) United States Patent
Yahara et al.

(10) Patent No.: US 11,350,517 B2
(45) Date of Patent: May 31, 2022

(54) CIRCUIT DEVICE AND POWER CONVERSION DEVICE

(71) Applicant: Mitsubishi Electric Corporation, Tokyo (JP)

(72) Inventors: Hiroyuki Yahara, Tokyo (JP); Kenta Fujii, Tokyo (JP); Yuji Shirakata, Tokyo (JP); Tomohito Fukuda, Tokyo (JP); Takashi Kumagai, Tokyo (JP); Koji Nakajima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/963,294

(22) PCT Filed: Jan. 18, 2019

(86) PCT No.: PCT/JP2019/001496
§ 371 (c)(1),
(2) Date: Jul. 20, 2020

(87) PCT Pub. No.: WO2019/146524
PCT Pub. Date: Aug. 1, 2019

(65) Prior Publication Data
US 2020/0367353 A1   Nov. 19, 2020

(30) Foreign Application Priority Data

Jan. 25, 2018   (JP) .............................. JP2018-010658

(51) Int. Cl.
*H05K 7/20* (2006.01)
*H05K 1/02* (2006.01)
(Continued)

(52) U.S. Cl.
CPC .......... *H05K 1/0203* (2013.01); *H02M 7/003* (2013.01); *H05K 1/181* (2013.01); *H05K 7/2089* (2013.01); *H05K 2201/2036* (2013.01)

(58) Field of Classification Search
None
See application file for complete search history.

(56) References Cited

U.S. PATENT DOCUMENTS 8,432,030 B2 *   4/2013   Malhan ............. H01L 23/49844
                                                                  257/690
8,908,374 B2 *  12/2014   Takatsuka ............... H05K 7/209
                                                                  361/704
(Continued)

FOREIGN PATENT DOCUMENTS

JP   H02113362 U   9/1990
JP   H10-041678 A  2/1998
(Continued)

OTHER PUBLICATIONS

International Search Report (with English Translation) and Written Opinion issued in corresponding International Patent Application No. PCT/JP2019/001496, 8 pages (dated Apr. 2, 2019).
(Continued)

*Primary Examiner* — Courtney L Smith
(74) *Attorney, Agent, or Firm* — Buchanan Ingersoll & Rooney PC

(57) ABSTRACT

A circuit device capable of significantly improving heat dissipation performance of a printed circuit board without increasing the size includes a printed circuit board, a mounted component, a non-solid metal spacer, a cooler, and a resin layer. The mounted component is at least partially disposed on at least one main surface of printed circuit board. The non-solid metal spacer is disposed at least on one main surface of the printed circuit board. The cooler is disposed at the non-solid metal spacer on the opposite side
(Continued)

to the printed circuit board. The resin layer is disposed between the non-solid metal spacer and the cooler. The non-solid metal spacer has a shape that allows at least one hollow portion to be formed between the printed circuit board and the cooler.

16 Claims, 20 Drawing Sheets

(51) Int. Cl.
*H02M 7/00* (2006.01)
*H05K 1/18* (2006.01)

(56) References Cited

U.S. PATENT DOCUMENTS

| | | | |
|---|---|---|---|
| 9,686,854 B2* | 6/2017 | Sanada | H05K 1/0204 |
| 10,743,442 B2* | 8/2020 | Joshi | F28F 13/02 |
| 2001/0004313 A1 | 6/2001 | Yamaoka | |
| 2014/0268594 A1* | 9/2014 | Wang | H05K 1/189 |
| | | | 361/749 |
| 2014/0268780 A1* | 9/2014 | Wang | F21S 4/22 |
| | | | 362/249.06 |
| 2016/0060098 A1* | 3/2016 | Ikehashi | B81B 3/0021 |
| | | | 257/415 |
| 2017/0133308 A1* | 5/2017 | Inaba | H01L 24/32 |
| 2019/0081468 A1* | 3/2019 | Chin | H02G 3/16 |
| 2020/0273839 A1* | 8/2020 | Elsherbini | H01L 25/50 |

FOREIGN PATENT DOCUMENTS

| | | |
|---|---|---|
| JP | 2001168562 A | 6/2001 |
| JP | 2004296720 A | 10/2004 |
| JP | 2006253205 A | 9/2006 |
| JP | 2008153400 A | 7/2008 |
| JP | 2015018864 A | 1/2015 |

OTHER PUBLICATIONS

Office Action (Notice of Reasons for Refusal) dated Aug. 31, 2021, in corresponding Japanese Patent Application No. 2019-567043 and English translation of the Office Action. (6 pages).

\* cited by examiner

CIRCUIT DEVICE AND POWER CONVERSION DEVICE

TECHNICAL FIELD

The present invention relates to a circuit device and a power conversion device and more particularly to size reduction and high-heat dissipation mounting techniques for power electronic devices.

BACKGROUND ART

As a conventional circuit device, an example is disclosed, for example, in Japanese Patent Laying-Open No. 2006-253205 (PTL 1) in which an aluminum tube having a coolant channel is integrally stacked on a non-component mounted surface of a printed circuit board with an insulating layer interposed.

In a reflow process that is common inexpensive soldering means, first, a cream-like solder paste including flux in solder powder is screen-printed at an even thickness on a printed circuit board. A surface-mount component is then disposed on the printed circuit board, for example, by a mounter. The solder is thereafter melted in a furnace to bond the printed circuit board and the surface-mount component.

Most of surface-mount components used in the reflow process described above have a base plate having a thermal diffusion function on the mount surface side in contact with the printed circuit board. On the other hand, the non-mount surface side of the surface-mount component is sealed with a package made of a resin having electrical insulating properties with a low thermal conductivity. It is therefore difficult to efficiently cool the surface-mount component from the non-mount surface side. In Japanese Patent Laying-Open No. 2006-253205 above, heat generated in the mounted component is conducted to the printed circuit board and cooled using a cooler connected to the non-component mount surface of the printed circuit board.

CITATION LIST

Patent Literature

PTL 1: Japanese Patent Laying-Open No. 2006-253205

SUMMARY OF INVENTION

Technical Problem

There has been an increasing demand for smaller size and higher efficiency in power conversion devices and the like serving as power circuits using large current.

The size reduction and capacity increasing of circuit devices included in power conversion devices is therefore extremely important.

In order to meet the demand for size reduction and capacity increasing, it is necessary to connect the printed circuit board and the cooler with an insulating resin layer interposed, as in Japanese Patent Laying-Open No. 2006-253205. The insulating resin layer, however, does not have a good thermal conductivity. When an insulating resin layer is used, therefore, it is important to reduce the thermal resistance between the printed circuit board and the cooler. In order to do so, a technique is necessary that diffuses heat generated in the printed circuit board and transfers heat toward the cooler using a heat-transfer cross-sectional area as large as possible. However, increasing the size of the printed circuit board for increasing the heat-transfer cross-sectional area increases the entire circuit device, accordingly. It is necessary to avoid such a size increase of the circuit device and to increase the cooling efficiency from the printed circuit board to the cooler.

The present invention is made in view of the problem described above. An object of the present invention is to provide a circuit device capable of significantly improving the heat dissipation performance of a printed circuit board without increasing the size, and a power conversion device including the same.

Solution to Problem

A circuit device in the present embodiment includes a printed circuit board, a mounted component, a non-solid metal spacer, a cooler, and a resin layer. The mounted component is at least partially disposed on at least one main surface of the printed circuit board. The non-solid metal spacer is disposed on at least one main surface of the printed circuit board. The cooler is disposed at the non-solid metal spacer on an opposite side to the printed circuit board. The resin layer is disposed between the non-solid metal spacer and the cooler. The non-solid metal spacer has a shape that allows at least one hollow portion to be formed between the printed circuit board and the cooler.

Advantageous Effects of Invention

According to the present invention, the non-solid metal spacer disposed between the printed circuit board and the cooler functions as a heat spreader for the printed circuit board and a thermal bridge between the printed circuit board and the cooler. The non-solid metal spacer can significantly improve the heat dissipation performance of the printed circuit board without increasing the size of the circuit device. This configuration can provide a circuit device in which large current flows through a mounted component mounted on a printed circuit board, or components are densely mounted in a printed circuit board, and a power conversion device including the same.

DESCRIPTION OF EMBODIMENTS

Embodiments of the present invention will be described below with reference to the drawings.

First Embodiment

Figure 1:
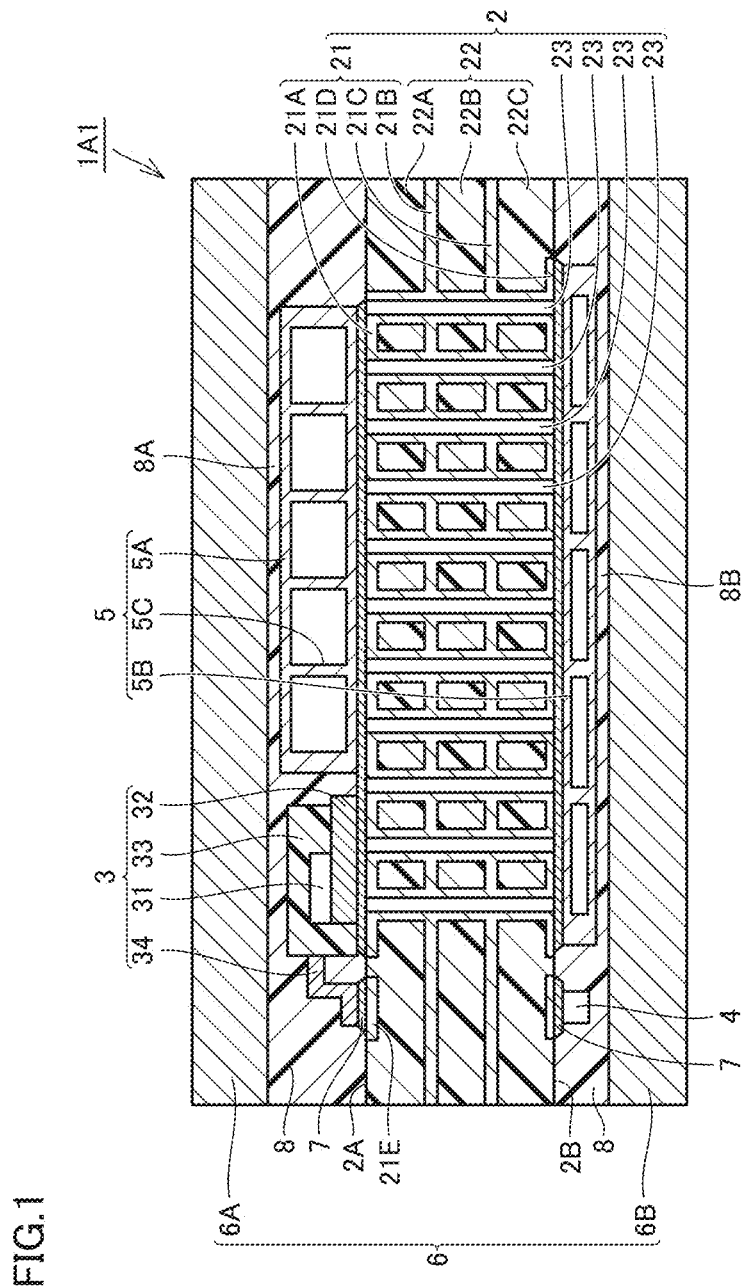
FIG. 1 is a schematic cross-sectional view showing a configuration of a circuit device according to a first example of a first embodiment.
Figure 2:
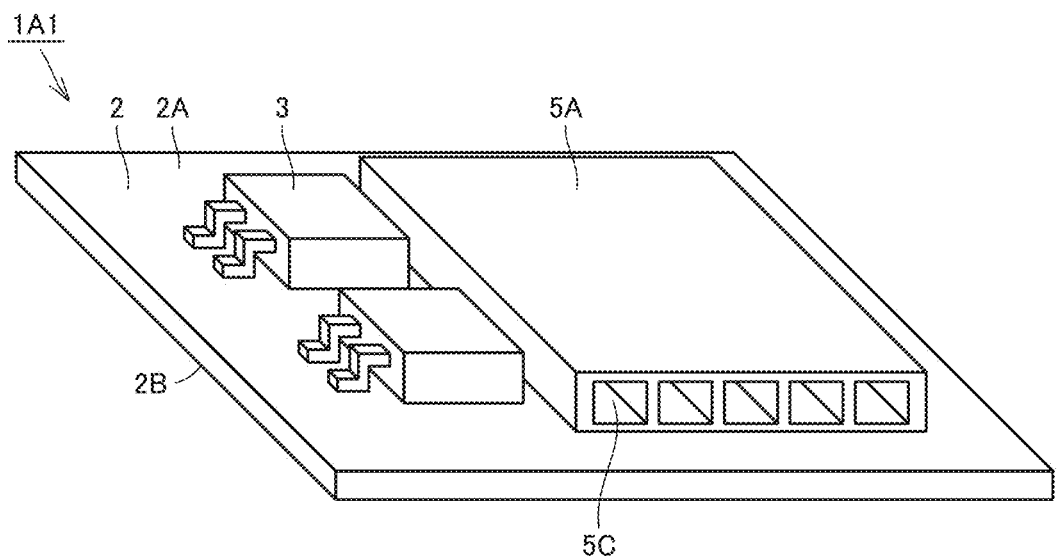
FIG. 2 is a schematic perspective view showing a configuration of the circuit device according to the first embodiment, with a focus on a part including mounted components and a non-solid metal spacer.

First of all, a configuration of a circuit device in the present embodiment is described with reference to FIG. 1 to FIG. 6. FIG. 1 is a schematic cross-sectional view showing a configuration of a circuit device according to a first example of a first embodiment. FIG. 2 is a schematic perspective view showing a configuration of the circuit device according to the first embodiment, with a focus on a part including mounted components and a non-solid metal spacer. FIG. 3 to FIG. 6 are schematic perspective views showing first to fourth examples of the configuration of the non-solid metal spacer according to the first embodiment. FIG. 2 shows metal spacers 5A and 5B in the first example of the present embodiment, which will be specifically described later.

Referring to FIG. 1 and FIG. 2, circuit device 1A1 in the first example of the present embodiment mainly includes a printed circuit board 2, a semiconductor component 3 as a mounted component, an electronic component 4 as another component, a metal spacer 5 as a non-solid metal spacer, and a cooler 6.

Printed circuit board 2 is a flat plate-shaped member having one main surface 2A and the other main surface 2B, in which the other main surface 2B is disposed on the opposite side to one main surface 2A. In a two-dimensional view, printed circuit board 2 preferably, but not limited to, has one main surface 2A and the other main surface 2B, for example, having a rectangular shape.

Printed circuit board 2 includes at least one conductor layer 21, an insulating layer 22, and a through hole 23. Conductor layer 21 extends along one main surface 2A and the other main surface 2B of printed circuit board 2. Conductor layer 21 includes four conductor layers 21A, 21B, 21C, and 21D in the example in FIG. 1. However, the number of conductor layers is not limited, and three or less or five or more conductor layers may be provided. Conductor layers 21A, 21B, 21C, and 21D are disposed in this order from the upper side to the lower side and spaced apart from each other in FIG. 1. In FIG. 1, conductor layers 21B and 21C extends entirely in the direction along one main surface 2A of printed circuit board 2, whereas conductor layers 21A and 21D extend partially in the direction along one main surface 2A of printed circuit board 2. However, the embodiment is not limited to such a configuration. Conductor layers 21B and 21C may also extend only partially in the direction along one main surface 2A, and conductor layers 21A and 21D may also extend entirely in the direction along one main surface 2A.

Insulating layer 22 is a region of an insulting material serving as a base for printed circuit board 2. Insulating layer 22 is divided by conductor layers 21A to 21D into three insulating layers 22A, 22B, and 22C. In the example in FIG. 1, insulating layers 22A, 22B, and 22C are disposed in this order from the upper side to the lower side. Here, the surface of the top portion of insulating layer 22A in FIG. 1 is flush with the surface of the top portion of conductor layer 21A, and these surfaces form one main surface 2A of printed circuit board 2 as a whole. Similarly, here, the surface of the bottom portion of insulating layer 22C in FIG. 1 is flush with the surface of the bottom portion of conductor layer 21D, and these surfaces form the other main surface 2B of printed circuit board 2 as a whole.

Through hole 23 is a portion extending in the body of printed circuit board 2 including conductor layer 21 and insulating layer 22 to pass through printed circuit board 2 from one main surface 2A to the other main surface 2B. Through hole 23 extends from one main surface 2A to the other main surface 2B in a direction intersecting (for example, orthogonal to) one main surface 2A of printed circuit board 2. Through hole 23 is a columnar hollow region formed in the inside of a tubular conductor layer connecting to conductor layers 21A, 21B, 21C, and 21D and extending in the direction intersecting one main surface 2A. The portion of the conductor layer of through hole 23 can selectively connect conductor layers 21A, 21B, 21C, and 21D. The above-noted tubular conductor layer that forms the sidewall of through hole 23 is, for example, cylindrical so that heat transmitted from above one main surface 21A to conductor layer 21A can be transmitted to conductor layers 21B, 21C, and 21D.

Conductor layers 21A, 21B, 21C, and 21D and the tubular conductor layer on the outside of through hole 23 are preferably formed of a metal material with a low electrical resistance, such as copper. Insulating layers 22A, 22B, and 22C are preferably an insulating resin layer formed by thermosetting glass fiber cloth such as FR4 impregnated with epoxy, for example.

Semiconductor component 3 as a mounted component is at least partially disposed on at least one main surface 2A of printed circuit board 2. In circuit device 1A1, the whole is disposed on one main surface 21A of printed circuit board 2. Semiconductor component 3 includes a semiconductor device 31, a base plate 32, a resin package 33, and a lead frame 34. Semiconductor component 3 in circuit device 1A1 is sealed in a surface mount-type IC package, such as TO-252.

Semiconductor device 31 is formed with a field-effect transistor made of a semiconductor material such as silicon (Si), silicon carbide (SiC), and gallium nitride (GaN). However, semiconductor device 31 may be formed with a semiconductor device other than a field-effect transistor, such as a diode or an IGBT (Insulated Gate Bipolar Transistor). Base plate 32 is a plate-shaped member made of a metal material with a high thermal conductivity, such as copper. Semiconductor device 31 is placed on the upper surface of base plate 32, of which lower surface is connected to printed circuit board 2. Resin package 33 is disposed so as to cover semiconductor device 31 on base plate 32 and a part of a side surface of base plate 32. Resin package 33 thus seals semiconductor device 31. Resin package 33 is formed of an epoxy-based resin material including a filler such as heat conductive ceramic.

Lead frame 34 is for electrically connecting semiconductor device 31 to the outside. Lead frame 34 is a member formed of a metal material with a low electrical resistance, such as copper. However, the surface of the metal material of lead frame 34 is plated with tin, for example. In circuit device 1A1, lead frame 34 is electrically connected to conductor layer 21E. Conductor layer 21E is a part of conductor layer 21 similar to conductor layer 21A, and the top surface thereof forms one main surface 2A of printed circuit board 2. Conductor layer 21E is electrically insulated from conductor layers 21A to 21D with insulating layer 22A interposed. Base plate 32 of semiconductor device 31 is electrically connected to conductor layer 21A on one main surface 2A through solder layer 7.

Electronic component 4 is disposed on the other main surface 2B of printed circuit board 2. Electronic component 4 is preferably one selected from the group consisting of semiconductor components, magnetic components, and resistance components. In the present embodiment, a semiconductor component is used as electronic component 4. Electronic component 4 is electrically connected to conductor layer 21D on the other main surface 2B through solder layer 7.

Metal spacer 5 is disposed at least on one main surface 2A of printed circuit board 2. Circuit device 1A1 in FIG. 1 has two metal spacers 5: a metal spacer 5A as a first non-solid metal spacer and a metal spacer 5B as a second non-solid metal spacer. Metal spacer 5A is disposed on one main surface 2A of printed circuit board 2 at a distance from semiconductor component 3. Metal spacer 5B is disposed on the other main surface 2B of printed circuit board 2 at a distance from electronic component 4.

Metal spacer 5A is bonded to conductor layer 21A on one main surface 2A by solder layer 7 as a first bonding material. Metal spacer 5B is bonded to conductor layer 21D on the other main surface 2B by solder layer 7 as a first bonding material. The shape of metal spacers 5A and 5B will be described later.

Solder layer 7 serving as the first bonding material that bonds metal spacer 5 and printed circuit board 2 preferably has a melting point lower than the melting point of the metal material forming metal spacers 5A and 5B. Specifically, a low-melting point alloy containing, for example, tin, gold, silver, and nickel is used for solder layer 7. Alternatively, a thin thermal interface material with a high thermal conductivity such as heat conductive grease or conductive adhesive such as silver paste may be used for solder layer 7.

Cooler 6 is disposed on metal spacer 5 on the opposite side to printed circuit board 2. Specifically, a cooler 6A as a first cooler is provided on metal spacer 5A on the opposite side to printed circuit board 2, that is, on one main surface 2A. A cooler 6B as a second cooler is provided on metal spacer 5B on the opposite side to printed circuit board 2, that is, on the other main surface 2B. That is, circuit device 1A1 in FIG. 1 has two coolers 6: cooler 6A and cooler 6B.

Coolers 6A and 6B are, for example, comb-shaped heatsinks made of metal. Coolers 6A and 6B are disposed such that their base surfaces face printed circuit board 2. However, coolers 6A and 6B are not limited thereto. That is, liquid-cooling jackets or heat pipe-type heatsinks may be used as coolers 6A and 6B. Alternatively, metal plates connected to liquid-cooling jackets or heat pipe-type heatsinks may be used as coolers 6A and 6B.

As described above, semiconductor component 3 and metal spacer 5A are disposed between cooler 6A and printed circuit board 2. In other words, metal spacer 5A is disposed so as to be inserted between cooler 6A and printed circuit board 2 with respect to the top-bottom direction in FIG. 1. Similarly, metal spacer 5B is disposed so as to be inserted between cooler 6B and printed circuit board 2 with respect to the top-bottom direction in FIG. 1.

A resin layer 8 is disposed in the region in which semiconductor component 3 and metal spacer 5A are disposed, that is, the region between printed circuit board 2 and cooler 6A. Similarly, a resin layer 8 is disposed in the region in which semiconductor component 4 and metal spacer 5B are disposed, that is, the region between printed circuit board 2 and cooler 6B. For example, resin layers 8 are preferably, but not limited to, disposed such that metal spacers 5A and 5B are embedded. As used herein "embed" means that resin layers 8 are disposed to cover over the surfaces of metal spacers 5A and 5B such that the hollow portions formed in metal spacers 5A and 5B described later are not filled.

Resin layer 8 in FIG. 1 embeds the region between printed circuit board 2 and cooler 6A in which metal spacer 5A is disposed, so as to be in contact with the surfaces of printed circuit board 2 and cooler 6A. Similarly, resin layer 8 embeds the region between printed circuit board 2 and cooler 6B in which metal spacer 5B is disposed, so as to be in contact with the surfaces of printed circuit board 2 and cooler 6B.

Resin layer 8 is formed of a resin material having an excellent thermal conductivity. Specifically, it is formed of a resin material such as epoxy or silicone. Resin layer 8 contains a filler and the like to increase its thermal conductivity and has electrical insulating properties. For example, silicon oxide ($SiO_2$) or aluminum oxide ($Al_2O_3$) is used as the filler. Silicon oxide or aluminum oxide above has a thermal conductivity higher than resin materials such as epoxy or silicone and has high electrical insulating properties.

Resin layers 8 are formed by being supplied between printed circuit board 2 and coolers 6A, 6B using potting (injection sealing) or a transfer mold process. Thus, the bonding of resin layers 8 to coolers 6A and 6B and of resin layers 8 to printed circuit board 2 is achieved without a bonding layer.

As shown in FIG. 1, resin layers 8 may be supplied to the entire regions between printed circuit board 2 and coolers 6A, 6B. However, in the region in which resin layer 8 is formed, particularly, at a region 8A having a small thickness between cooler 6A and metal spacer 5A, a high thermal conductive resin layer with an even higher thermal conductivity than the other region in the resin layer 8 may be disposed. Similarly, in the region in which resin layer 8 is formed, particularly, at a region 8B having a small thickness between cooler 6B and metal spacer 5B, a high thermal conductive resin layer with an even higher thermal conductivity than the other region in resin layer 8 may be disposed. In this case, resin layers 8 is not necessarily disposed as shown in FIG. 1 but may be disposed only at a part of the region between printed circuit board 2 and coolers 6A, 6B as long as regions 8A and 8B are included. The thickness of region 8A, 8B is sufficiently smaller than the thickness of cooler 6A, 6B adjacent thereto. Sheet-like resin members may be disposed in regions 8A and 8B. In this case, sheet-like uncured resin members are disposed in regions 8A, 8B and thereafter cured. Regions 8A and 8B of the thus cured resin members affix coolers 6A and 6B to metal spacers 5A and 5B.

The resin members used in regions 8A and 8B are not limited to curable ones as described above. For example, non-curable gel sheets may be used as the sheet-like members in regions 8A and 8B, and other fixing members for insulating printed circuit board 2 from coolers 6A and 6B may be provided as separate parts in the regions of resin layers 8 other than regions 8A and 8B. That is, an insulating material other than resin materials may be disposed in a region other than regions 8A and 8B.

The material and the shape of metal spacers 5A and 5B will now be described in detail.

For example, as shown in FIG. 1 and FIG. 2, metal spacers 5A and 5B have an outer shape of a rectangular parallelepiped and have a shape such that at least one hollow portion 5C can be formed between printed circuit board 2 and coolers 6A, 6B. That is, metal spacers 5A and 5B have a plurality of hollow portions 5C extending in a columnar shape, for example, so as to pass through in the depth direction of FIG. 1 and FIG. 2. It is preferable that a plurality of hollow portions 5C are formed so as to be spaced apart from each other with respect to the direction along one main surface 2A in FIG. 1. In FIG. 1 and FIG. 2, five hollow portions 5C are formed, as an example. However, the embodiment is not limited thereto, and four or less or six or more hollow portions 5C may be formed. In FIG. 1 and FIG. 2, hollow portion 5C has a quadrature prism shape. However, the embodiment is not limited thereto and, for example, hollow portion 5C may have a cylindrical shape. In hollow portions 5C, the resin material of resin layers 8 that cover metal spacers 5A and 5B does not intrude, and a hollow state is kept.

As used herein "non-solid" means that the body of metal spacers 5A and 5B that is formed of a metal material is not solid. That is, the inside of hollow portions 5C in which no metal material is present may be filled with a material other than the metal material forming the body of metal spacers 5A and 5B.

Metal spacers 5A and 5B are formed of a metal material having a high thermal conductivity. Specifically, they are formed of a metal material such as copper, aluminum, iron, nickel, tin, magnesium, and zinc, or an alloy made of two or more metal materials selected from the above-noted group. Alternatively, metal spacers 5A and 5B may be formed of a cladding material that is a combination of one of the above metal materials and two or more of the above metal materials. With the use of such materials, metal spacers 5A and 5B can efficiently transmit heat of printed circuit board 2 toward coolers 6A and 6B. Plating layers of, for example, tin or electroless nickel may be formed on the surfaces of spacers 5A and 5B. This imparts good solder wettability to metal spacers 5A and 5B.

In FIG. 1 and FIG. 2, only one metal spacer 5A is installed. However, the embodiment is not limited thereto, and a plurality of metal spacers 5B may be installed. This is applicable to metal spacer 5B.

Figure 3:
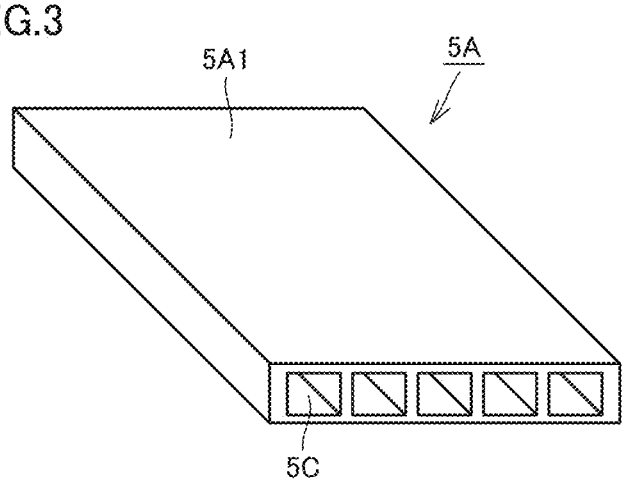
FIG. 3 is a schematic perspective view showing a first example of the configuration of the non-solid metal spacer according to the first embodiment.

Metal spacer 5A shown in FIG. 1 and FIG. 2 has a flat tube 5A1 in the shape of a rectangular parallelepiped as shown in FIG. 3. Flat tube 5A1 is configured such that, for example, five hollow portions 5C extending in the shape of a quadrature prism so as to pass through in the depth direction of FIG. 3 are formed so as to spaced apart from each other in the right-left direction in the drawing. However, the embodiment is not limited thereto, and for example, metal spacer 5A may have a configuration shown in FIG. 4 to FIG. 6. This is applicable to metal spacer 5B. As used herein "flat tube 5A" refers to the one in which the dimension in the right-left direction of the entire metal spacer 5A in FIG. 3 is longer than the dimension in the top-bottom direction (thickness direction).

Figure 4:
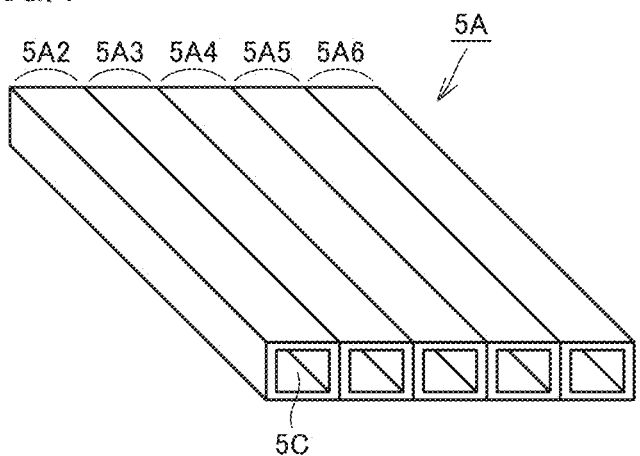
FIG. 4 is a schematic perspective view showing a second example of the configuration of the non-solid metal spacer according to the first embodiment.

Referring to FIG. 4, in metal spacer 5A, for example, five square tubes 5A2, 5A3, 5A4, 5A5, and 5A6 in the shape of an elongated rectangular parallelepiped extending in the depth direction in the drawing may be arranged side by side so as to be affixed to each other and have an outer shape as a whole substantially similar to that of flat tube 5A in FIG. 3. In each of square tubes 5A2 to 5A6 in FIG. 4, hollow portion 5C in the same manner as hollow portion 5C formed in flat tube 5A in FIG. 3 is formed so as to pass through in the depth direction in FIG. 4.

Figure 5:
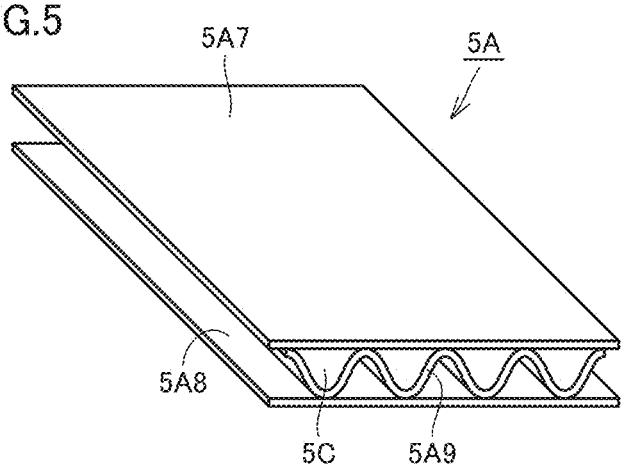
FIG. 5 is a schematic perspective view showing a third example of the configuration of the non-solid metal spacer according to the first embodiment.

Referring to FIG. 5, metal spacer 5A may have a pair of metal flat plates 5A7 and 5A8 facing each other and a corrugated metal plate 5A9 provided therebetween. Corrugated metal plate 5A9 looks like a series of curved waves as viewed from the front side in FIG. 5. Corrugated metal plate 5A9 extends to and fro between metal flat plate 5A7 and metal flat plate 5A8 at regular intervals with respect to the right-left direction in the drawing while coming into contact with these flat plates. A plurality of hollow portions 5C are thus formed between metal flat plates 5A7, 5A8 and corrugated metal plate 5A9 to pass through the entire region occupied by metal flat plates 5A7, 5A8 with respect to the depth direction in the drawing.

Figure 6:
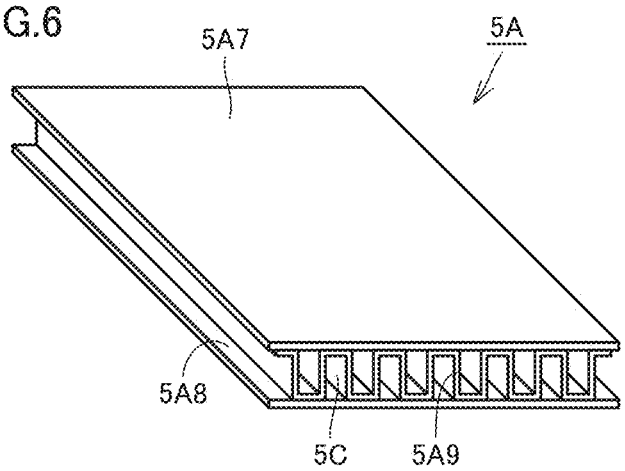
FIG. 6 is a schematic perspective view showing a fourth example of the configuration of the non-solid metal spacer according to the first embodiment.

Referring to FIG. 6, corrugated metal plate 5A9 of metal spacer 5A in FIG. 5 may look like a series of rectangular waves as viewed from the front side. Also in this case, quadrature corrugated metal plate 5A9 extends to and fro between metal flat plate 5A7 and metal flat plate 5A8 at regular intervals with respect to the right-left direction in the drawing while coming into contact with these flat plates. A plurality of hollow portions 5C are thus formed between metal flat plates 5A7, 5A8 and corrugated metal plate 5A9, in the same manner as in FIG. 5.

As described above, in metal spacer 5A in the present embodiment, hollow portion 5C is formed to have a pair of first portions of a metal wall extending along one main surface 2A that forms the body of metal spacer 5A on both the upper side (cooler 6A side) and the lower side (printed circuit board 2 side), in all the examples in FIG. 3 to FIG. 6. The metal wall serving as the first portions corresponds to a pair of metal flat plates 5A7 and 5A8 that enclose hollow portion 5C from the upper side and the lower side in FIG. 5 and FIG. 6. Therefore, a pair of first portions face each other at a distance from each other in the longitudinal direction. One of a pair of first portions, specifically, the first portion disposed on the printed circuit board 2 side is bonded to printed circuit board 2.

In metal spacer 5A in the present embodiment, hollow portion 5C is formed to have portions of the metal wall that forms the body of metal spacer 5A on both of the left side and the right side, in all the examples in FIG. 3 to FIG. 6. This metal wall is a plurality of second portions extending in the direction intersecting (substantially orthogonal to) one main surface 2A in FIG. 3 and FIG. 4 and extends in the region between a pair of first portions from each of a pair of first portions in the direction intersecting one main surface 2A. This second portion corresponds to corrugated metal plate 5A9 that forms hollow portion 5C together with metal flat plates 5A7 and 5A8 in FIG. 5 and FIG. 6. Corrugated metal plate 5A9 is disposed with spacings in the width direction with respect to the direction along one main surface 2A. That is, in metal spacer 5A in the present embodiment, hollow portion 5C is formed so as to be enclosed by the portions of the metal wall that forms the body of metal spacer 5A on the upper and lower sides and the right and left sides, in all of the examples in FIG. 3 to FIG. 6. The description above is applicable to metal spacer 5B.

More specifically, hollow portion 5C of metal spacer 5A is formed to have portions of the metal wall along one main surface 2A that forms the body of metal spacer 5B, on both the lower side (cooler 6B side) and the upper side (printed circuit board 2 side). Hollow portion 5C of metal spacer 5A is formed with the spacing in the width direction between a pair of second portions adjacent to each other, of a plurality of second portions.

Metal spacers 5A and 5B including metal flat plates 5A7 and 5A8 and corrugated metal plate 5A9 as a whole are formed of the above-noted metal material. Metal flat plates 5A7 and 5A8 and corrugated metal plate 5A9 can be formed by a press process with low cost.

In metal spacer 5A in FIG. 5 and FIG. 6, a pair of metal flat plates 5A7 and 5A8 can be connected to corrugated metal plate 5A9 by a metal material similar to the low-melting point metal that forms solder layer 7. In producing circuit device 1A1, it is preferable that, for example, a solder paste is applied to the surfaces facing each other of metal flat plates 5A7 and 5A8, and in a state in which corrugated metal plate 5A9 is set, a reflow process is performed simultaneously with printed circuit board 2. In this way, printed circuit board 2 and metal spacer 5A can be integrally formed through a reflow process at a time, and at the same time, as shown in FIG. 1 and the like, printed circuit board 2 can be connected with metal spacers 5A and 5B by solder layers 7.

Metal spacer 5A described above has a thickness equal to or larger than semiconductor component 3 with respect to the top-bottom direction in FIG. 1 intersecting one main surface 2A of printed circuit board 2. That is, both of metal spacer 5A and semiconductor component 3 are connected on one main surface 2A of printed circuit board 2. In this configuration, the top surface in FIG. 1 of metal spacer 5A is disposed above the top surface in FIG. 1 of semiconductor component 3. Similarly, metal spacer 5B has a thickness equal to or larger than electronic component 4 with respect to the top-bottom direction in FIG. 1 intersecting the other main surface 2B of printed circuit board 2. That is, both of metal spacer 5B and electronic component 4 are connected on the other main surface 2B of printed circuit board 2. In this configuration, the bottom surface in FIG. 1 of metal spacer 5B is disposed below the bottom surface in FIG. 1 of electronic component 4. In this way, metal spacers 5A and 5B are formed to be thicker than the mounted component, whereby the surfaces of coolers 6A and 6B that face metal spacers 5A and 5B can be formed to be entirely flat (such that protrusions and projections are not formed intentionally). Coolers 6A and 6B thus can be produced more easily.

The portion of the metal wall serving as the second portions of metal spacers 5A and 5B is not limited to the planar shape extending linearly in cross section as described above. More specifically, the second portion may have, for example, a grid-pattern shape or a honeycomb shape. It is preferable that a plurality of second portions (as many as possible) are provided to transmit heat from printed circuit board 2 to coolers 6A and 6B and that the region sandwiched between metal spacer 5A, 5B and cooler 6A, 6B is covered with resin layer 8 over an area as large as possible so that resin layer 8 conducts heat well between the metal spacer and the cooler.

Assuming that the printed circuit board is cooled from the component mounted-surface side, the problem of comparative examples to the present embodiment will be described first, and then the operation effect of the present embodiment will be described.

As previously mentioned in the Problem to be Solved by the Invention section, there has been an increasing demand for size reduction and increasing efficiency in power conversion devices and the like serving as power circuits using large current. Thus, the size reduction and capacity increasing of circuit devices included in power conversion devices is extremely important.

In order to meet the demand for size reduction and capacity increasing, it is necessary to connect the printed circuit board to the cooler by an insulating resin layer. The insulating resin layer, however, does not have a good thermal conductivity. When an insulating resin layer is used, therefore, it is important to reduce the thermal resistance between the printed circuit board and the cooler. In order to do so, a technique is necessary that diffuses heat generated in the printed circuit board and transfers heat toward the cooler using a heat transfer cross-sectional area as large as possible. However, increasing the size of the printed circuit board for increasing the heat transfer cross-sectional area increases the size of the entire circuit device, accordingly. It is necessary to avoid the size increase of the circuit device and to increase the cooling efficiency from the printed circuit board to the cooler.

For example, as a first comparative example, a heat dissipation mechanism may be used, which dissipates heat from the mounted component to the outside through a package of, for example, epoxy resin with 0.2 W/mK or more to 10 W/mK or less. However, this first comparative example does not have a high cooling efficiency. For example, in a TO-252 package used for a surface-mount power semiconductor device, the thickness of the insulating resin layer is about 3 mm, and the section area of a region through which heat is transported is about 1 cm². Therefore, even when an insulating, high thermal conductive epoxy resin with a thermal conductivity of 3.0 W/mK is used, the thermal resistance on the surface side of the package is 10 K/W. The above-noted thermal resistance is ten or more times the common thermal resistance value 1.0 K/W of TO-252 packages and is almost no use as a heat transfer path.

As a second comparative example, an electrically-insulating heat conductive sheet may be sandwiched between the printed circuit board and the cooler to conduct heat. In this case, however, it is necessary to use a thick heat conductive sheet having a thickness equal to or larger than the mounted component, and this prevents heat conduction. For example, when a semiconductor component sealed in a TO-252 package having a thickness of about 4 mm is used, the distance between the printed circuit board and the cooler is 4 mm or more on the component mounted-surface side. However, in the component above, when the distance between the printed circuit board on the non-component-mounted surface side and the cooler is about 0.5 mm, the thermal resistance per unit area on the component-mounted surface side is eight times or more the thermal resistance per unit area on the non-component-mounted surface side. In order to achieve a thermal resistance on the component-mounted surface side equivalent to that on the non-component-mounted surface side, an area eight times or more as large as the non-component-mounted surface side is necessary on the component-mounted surface side. In this way, the cooling effect by heat dissipation of the printed circuit board on the component-mounted surface side is weak.

As a third comparative example, a metal spacer with a high thermal conductivity may be sandwiched between the printed circuit board and the cooler to dissipate heat of the printed circuit board toward the cooler. In this case, however, if the metal spacer of a thick plate with a large heat capacity is used, the temperature is less increased during soldering. It is therefore necessary to form the spacer with a small thin plate in order to reduce the heat capacity of the metal spacer. This is because otherwise it would be difficult to connect the printed circuit board to the cooler with the spacer by soldering such as a reflow process.

As a fourth comparative example, a high temperature section of the printed circuit board may be in direct contact with the cooler whereby the high temperature section is cooled by the cooler. In this case, it is necessary to provide an insulating layer between the high temperature section of the printed circuit board and the cooler, and a thin conductor layer diffuses heat in the printed circuit board. The thermal diffusion is thus insufficient in the printed circuit board, and heat flux concentrates on the narrow high temperature section. As a result, the thermal resistance of the printed circuit board is increased. As described above, with the comparative examples, it is difficult to effectively cool the heat-generating section from the component-mounted surface side.

Then, in the present embodiment, metal spacer 5A is provided at least on one main surface 2A of printed circuit board 2. This metal spacer 5A functions as a heat spreader on one main surface 2A of printed circuit board 2 and a thermal bridge between cooler 6A and printed circuit board 2. That is, heat transmitted to metal spacer 5A is transmitted therefrom to cooler 6A through resin layer 8. This configuration can efficiently cool printed circuit board 2. Because of a pair of first portions facing each other at a distance from each other in the longitudinal direction, it is ensured that metal spacer 5A has hollow portions 5C.

When the time constant of transient temperature increase of metal spacer 5A is r is determined by heat capacity× thermal resistance. Metal spacer 5A in the present embodiment has hollow portions 5C. Therefore, even when the thickness of metal spacer 5A is increased in the direction along the distance between printed circuit board 2 and cooler 6A, increase in heat capacity of metal spacer 5A can be suppressed. The temperature time constant τ of metal spacer 5A therefore can be reduced compared with a thick plate having the same volume and no hollow portion 5C. In addition, forming hollow portions 5C can reduce the mass of metal spacer 5A. Metal spacer 5A therefore can be easily soldered to printed circuit board 2 by inexpensive means such as a reflow process.

Metal spacer 5A having such hollow portions 5C are lightweight compared with a metal spacer of a thick plate. This can prevent increase in weight of metal spacer 5A.

Further, metal spacer 5A has hollow portion 5C, for example, in the shape of a quadrature prism as shown in FIG. 3 formed with a plurality of second portions (outer wall portions) spaced apart from each other in the width direction with respect to the direction along one main surface 2A. In this configuration, metal spacer 5A has a metal wall as an outer wall portion of hollow portion 5C, and this metal wall is disposed so as to connect printed circuit board 2 to cooler 6A. Heat of printed circuit board 2 therefore can be dissipated toward cooler 6A through a short path via the metal wall. Hence, metal spacer 5A can efficiently cool printed circuit board 2. The description above is applicable to metal spacer 5B on the other main surface 2B of printed circuit board 2.

As a fifth comparative example, a metal spacer may be connected so as to be sandwiched between the printed circuit board and the cooler, for example, using an adhesive or a heat conductive sheet. In this case, the layer of adhesive and heat conductive sheet prevents heat conduction from the printed circuit board to the cooler.

Then, in the present embodiment, as shown in FIG. 1, printed circuit board 2 includes conductor layer 21 along one main surface 2A, and metal spacer 5A is bonded to conductor layer 21 (conductor layer 21A in FIG. 1) by solder layer 7. This configuration can increase the efficiency of heat conduction from printed circuit board 2 to cooler 6A. In this case, metal spacer 5A can function as a thermal diffusion plate that spreads heat of printed circuit board 2 in the direction along one main surface 2A. Heat of printed circuit board 2 thus can be transmitted more efficiently to cooler 6A by metal spacer 5A. The description above is applicable to metal spacer 5B on the other main surface 2B of printed circuit board 2.

Solder layer 7 has a melting point lower than the melting point of the metal material forming metal spacer 5A. Solder layer 7 therefore can be used for bonding printed circuit board 2 in a temperature range in which metal spacer 5A can resist heat.

Next, for example, when a cooler alone is provided only on one main surface of the printed circuit board, a mounted component cannot be installed on one main surface. In this case, if a mounted component is mounted on the other main surface of the printed circuit board, the other main surface becomes uneven because of the mounted component. This makes it difficult to connect a cooler on the other main surface over a wide area. Accordingly, it is difficult to use the other main surface for a cooler of the printed circuit board.

The main surface of the printed circuit board on the side provided with the mounted component has an uneven shape. A cooler having a complicated shape conforming to this uneven shape may be used to cool the component-mounted surface of the printed circuit board. However, to produce such a cooler, die casting requiring an expensive die or complicated machining is necessary. This may lead to high costs.

In the present embodiment, cooler 6A is disposed at metal spacer 5A on the opposite side to printed circuit board 2. This configuration can suppress reduction in layout efficiency due to such an arrangement that one main surface 2A of printed circuit board 2 is occupied only by cooler 6A. Therefore, both of one main surface 2A and the other main surface 2B can be used for the coolers of printed circuit board 2. This configuration can increase the cooling efficiency by cooler 6A without increasing the size of circuit device 1A1.

In circuit device 1A1 in the present embodiment, metal spacer 5A as the first non-solid metal spacer is disposed on one main surface 2A, and metal spacer 5B as the second non-solid metal spacer is disposed on the other main surface 2B. In this configuration, printed circuit board 2 can be cooled efficiently from both of the one main surface side and the other main surface side, rather than from the one main surface side. That is, in circuit device 1A1, heat dissipation performance can be significantly improved without increasing the size of printed circuit board 2. Circuit device 1A1 therefore can withstand a heat generation density almost twice as high as when it is cooled only from one main surface side, without increasing the size or significantly increasing the weight of printed circuit board 2.

Metal spacer 5 in the present embodiment is formed of a relatively cheap metal material such as copper or aluminum. This can reduce the possibility of high cost.

In addition, base plate 32 in FIG. 1 is connected to conductor layer 21A of printed circuit board 2 through solder layer 7. In printed circuit board 2, through hole 23 electrically connects conductor layer 21A and conductor layer 21D. Metal spacer 5B is connected to conductor layer 21D through solder layer 7. Because of such a configuration, metal spacer 5B functions as a thermal diffusion plate that spreads heat of semiconductor component 3 in the direction along the other main surface 2B. Therefore, heat spread in metal spacer 5B in the direction along the other main surface 2B of printed circuit board 2 can be efficiently transmitted to cooler 6B.

Metal spacer 5A is connected to conductor layer 21A through solder layer 7. Because of such a configuration, metal spacer 5A functions as a thermal diffusion plate that spreads heat of semiconductor component 3 in the direction along one main surface 2A. Therefore, heat spread in metal spacer 5A in the direction along one main surface 2A of printed circuit board 2 can be efficiently transmitted to cooler 6A.

In addition, metal spacers 5A, 5B and semiconductor component 3 in FIG. 1 are connected to conductor layers 21A to 21D of printed circuit board 2 through a small thermal resistance formed by through holes 23 and the like, thereby increasing the heat capacity of semiconductor component 3 in a pseudo manner. This can suppress rapid temperature increase of semiconductor component 3 caused by a large amount of heat generated instantaneously by semiconductor component 3. Reduction in reliability of semiconductor component 3 due to repetition of such thermal shock also can be suppressed.

In addition, in the foregoing examples of the present embodiment, semiconductor component 3 and metal spacer 5A are connected by solder layer 7 as a first bonding material. In the present embodiment, therefore, heat generated by semiconductor component 3 can be transmitted to metal spacer 5A through the above-noted solder layer 7 efficiently, that is, quickly.

Modifications to the present embodiment will now be described.

Figure 7:
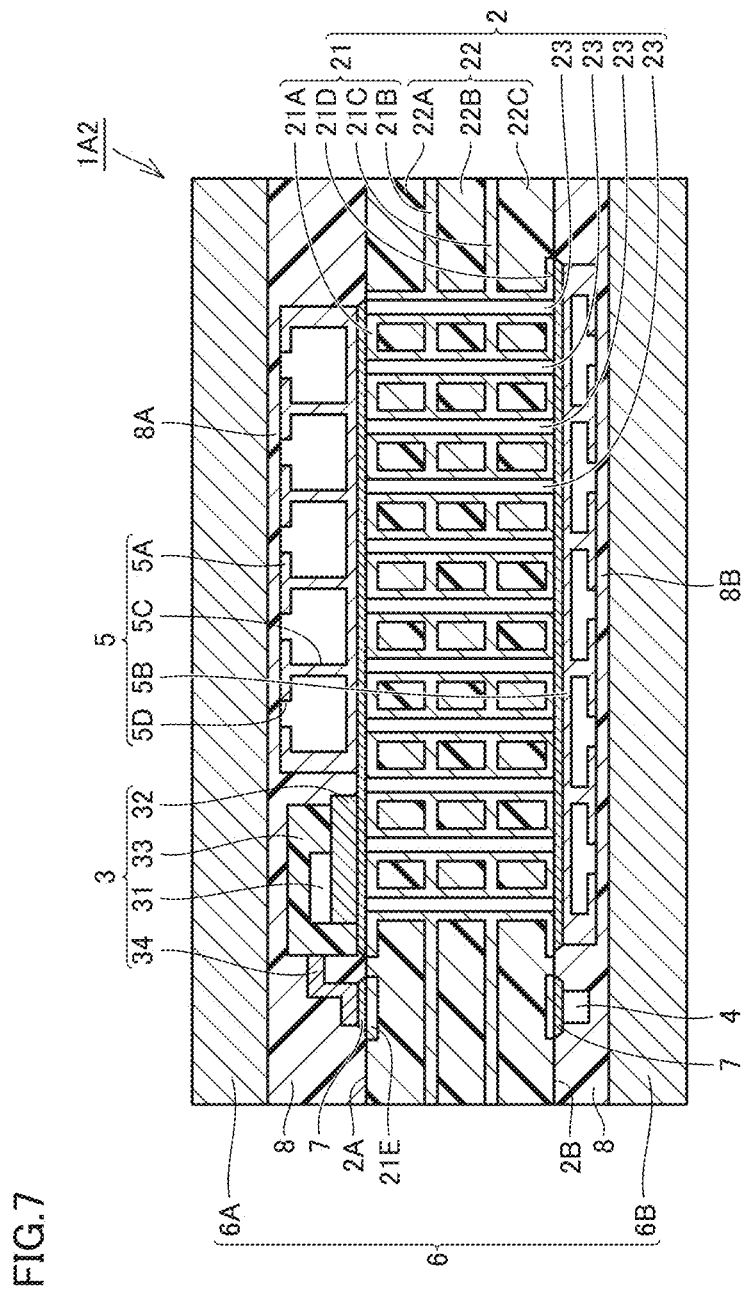
FIG. 7 is a schematic cross-sectional view showing a configuration of the circuit device according to a second example of the first embodiment.

FIG. 7 is a schematic cross-sectional view showing a configuration of a circuit device according to a second example of the first embodiment. Referring to FIG. 7, circuit device 1A2 in the second example of the present embodiment basically has a configuration similar to circuit device 1A1 (see FIG. 1) in the first example, and the same constituent elements are denoted by the same reference signs and will not be further elaborated. In circuit device 1A2, however, spacer through holes 5D are formed at a part of the respective surfaces of metal spacers 5A and 5B that face coolers 6A and 6B. In this respect, circuit device 1A2 differs from circuit device 1A1. Spacer through holes 5D are holes passing through portions of the metal walls along one main surface 2A of metal spacers 5A and 5B so as to extend from the respective outermost surfaces of metal spacers 5A and 5B that face coolers 6A and 6B to reach hollow portions 5C. A plurality of spacer through holes 5D are formed in each of metal spacers 5A and 5B. More specifically, it is preferable that one or more are formed for each of a plurality of hollow portions 5C formed in metal spacers 5A and 5B.

Circuit device 1A2 achieves the operation effect as follows. That is, resin layers 8 disposed so as to embed metal spacers 5A and 5B fill the regions between printed circuit board 2 and coolers 6A, 6B, for example, by potting. In doing so, the potting material that forms resin layers 8 intrudes from spacer through holes 5D even into hollow portions 5C formed in metal spacers 5A and 5B. That is, the inside of hollow portions 5C is easily filled with the potting material that forms resin layers 8. Therefore, heat can be conducted even better by metal spacers 5A and 5B in the regions between printed circuit board 2 and coolers 6A, 6B.

Figure 8:
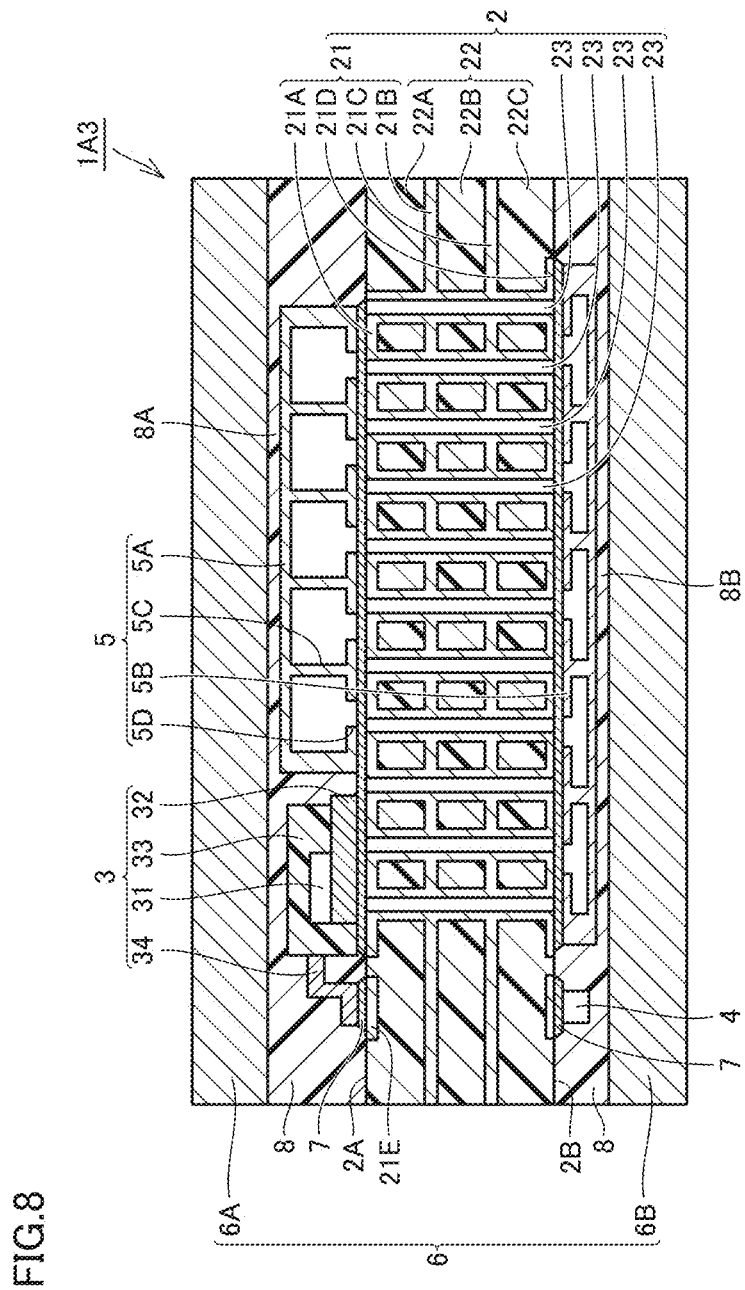
FIG. 8 is a schematic cross-sectional view showing a configuration of the circuit device according to a third example of the first embodiment.

FIG. 8 is a schematic cross-sectional view showing a configuration of a circuit device according to a third example of the first embodiment. Referring to FIG. 8, circuit device 1A3 in the third example of the present embodiment basically has a configuration similar to circuit device 1A2 (see FIG. 7) in the second example, and the same constituent elements are denoted by the same reference signs and will not be further elaborated. In circuit device 1A3, however, spacer through holes 5D described above are formed in a part of the respective surfaces of metal spacers 5A and 5B that face printed circuit board 2. In this respect, circuit device 1A3 differs from circuit device 1A2 in which spacer through holes 5D are formed in metal spacers 5A and 5B on the cooler 6A and 6B sides. In this case, spacer through holes 5D are holes passing through portions of the metal walls along one main surface 2A of metal spacers 5A and 5B so as to extend from the respective outermost surfaces of metal spacers 5A and 5B that face printed circuit board 2 to reach hollow portions 5C. Also in this case, as in FIG. 7, a plurality of spacer through holes 5D are formed in metal spacers 5A and 5B (one or more are formed for each of a plurality of hollow portions 5C formed in metal spacers 5A and 5B).

In this way, when spacer through holes 5D are provided on the printed circuit board 2 side, the following operation effect is achieved. That is, resin layers 8 disposed so as to embed metal spacers 5A and 5B fill the regions between printed circuit board 2 and coolers 6A, 6B, for example, by a reflow process. In doing so, spacer through holes 5D can be used, for example, as vent holes for the air in hollow portions 5C.

Here, spacer through holes 5D of metal spacers 5A and 5B can be formed, for example, by any one process method selected from the group consisting of press work, etching, and laser processing.

Figure 9:
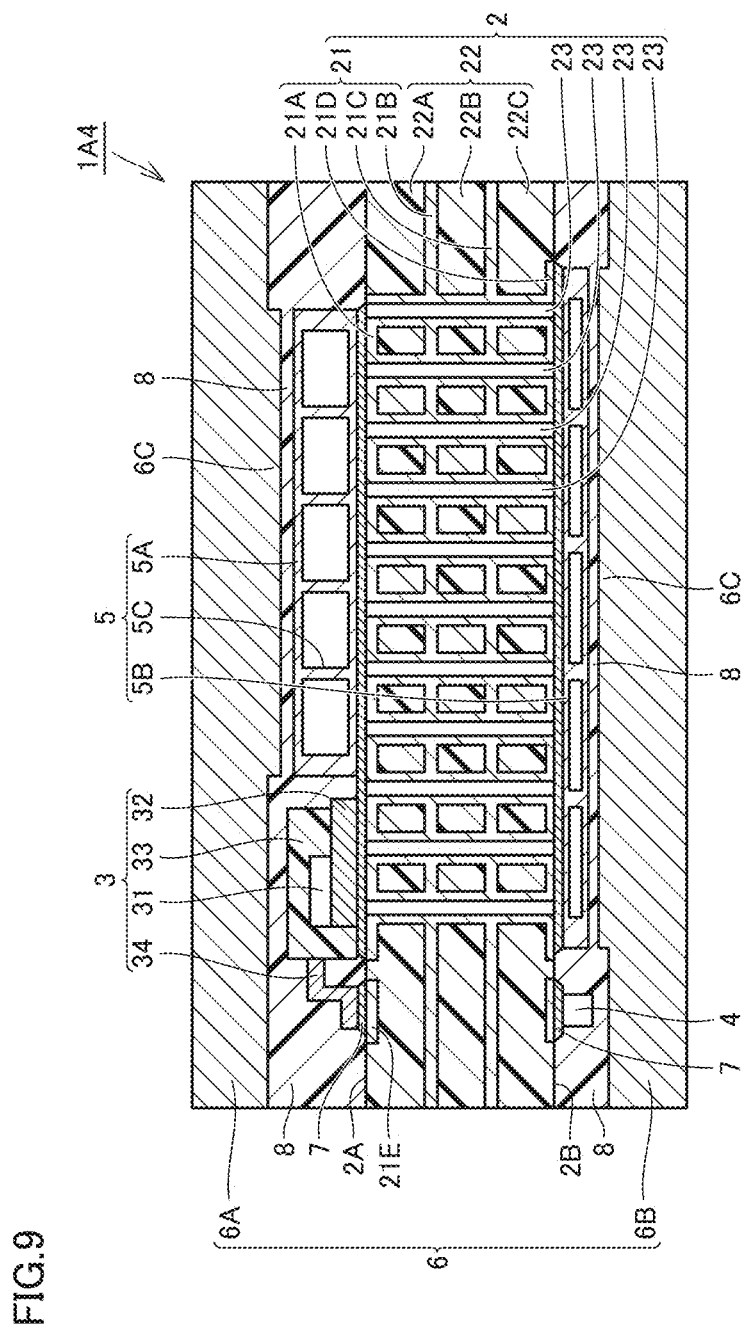
FIG. 9 is a schematic cross-sectional view showing a configuration of the circuit device according to a fourth example of the first embodiment.

FIG. 9 is a schematic cross-sectional view showing a configuration of a circuit device according to a fourth example of the first embodiment. Referring to FIG. 9, circuit device 1A4 in the fourth example of the present embodiment basically has a configuration similar to circuit device 1A1 (see FIG. 1) in the first example, and the same constituent elements are denoted by the same reference signs and will not be further elaborated. However, in circuit device 1A4, metal spacer 5A has a thickness smaller than semiconductor component 3 with respect to the top-bottom direction in FIG. 9 intersecting one main surface 2A of printed circuit board 2. That is, both of metal spacer 5A and semiconductor component 3 are connected on one main surface 2A of printed circuit board 2. In this configuration, the top surface in FIG. 9 of metal spacer 5A is disposed below the top surface in FIG. 9 of semiconductor component 3. Similarly, metal spacer 5B has a thickness smaller than electronic component 4 with respect to the top-bottom direction in FIG. 1 intersecting the other main surface 2B of printed circuit board 2. That is, both of metal spacer 5B and electronic component 4 are connected on the other main surface 2B of printed circuit board 2. In this configuration, the bottom surface in FIG. 1 of metal spacer 5B is disposed above the bottom surface in FIG. 1 of electronic component 4.

Coolers 6A and 6B in FIG. 9 therefore have protrusions 6C protruding toward metal spacers 5A and 5B, at their respective portions facing metal spacers 5A and 5B. Coolers 6A and 6B having such a shape are preferably formed by, for example, but not limited to, die casting, extrusion molding, or machining. In this respect, circuit device 1A4 differs from circuit device 1A1.

Circuit device 1A4 achieves the operation effect as follows. That is, even when the thickness of metal spacer 5A and 5B is smaller than the thickness of semiconductor component 3 and electronic component 4, a sufficient cooling efficiency from printed circuit board 2 to coolers 6A and 6B can be ensured. In order to do so, it is preferable that, for example, the thickness in the top-bottom direction in FIG. 9 of resin layers 8 in metal spacers 5A and 5B is larger than that in FIG. 1, for example. Alternatively, as shown in FIG. 9, it is preferable that, for example, coolers 6A and 6B have respective protrusions 6C protruding toward metal spacers 5A and 5B at the respective portions facing metal spacers 5A and 5B and these are in contact with metal spacers 5A and 5B.

Figure 10:
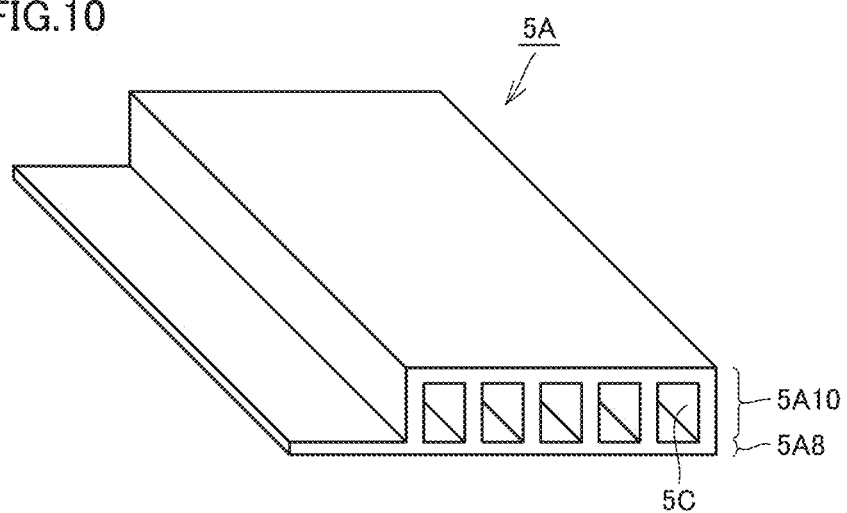
FIG. 10 is a schematic perspective view showing a fifth example of the configuration of the non-solid metal spacer according to the first embodiment.

FIG. 10 is a schematic perspective view showing a fifth example of the configuration of the non-solid metal spacer according to the first embodiment. Referring to FIG. 10, metal spacer 5A according to the fifth example of the present embodiment has a metal flat plate 5A8 and a comb-shaped portion 5A10. Comb-shaped portion 5A10 is a first region having a comb shape. More specifically, comb-shaped portion 5A10 includes a flat plate portion facing metal flat plate 5A8 such that their main surfaces are substantially parallel to each other. Comb-shaped portion 5A10 further includes portions splitting from the flat plate portion so as to be disposed side by side at certain intervals in the right-left direction in FIG. 10 and extending, for example, downward in FIG. 10 to intersect the main surface. Comb-shaped portion 5A10 is configured such that the flat plate portion and a plurality of portions splitting therefrom form a comb-like side surface shape. On the other hand, metal flat plate 5A8 is a flat plate-shaped second region connected in contact with the bottom of the portions extending downward in FIG. 10 of comb-shaped portion 5A10. The tip ends of the split portions of comb-shaped portion 5A10 are joined to and integrated with the main surface of metal flat plate 5A8, whereby a plurality of hollow portions 5C are formed therebetween. Hollow portions 5C each extend in a columnar shape so as to pass through in the depth direction in FIG. 10.

In metal spacer 5A in FIG. 10, metal flat plate 5A8 has an area larger than comb-shaped portion 5A10 in a two-dimensional view. Specifically, metal flat plate 5A8 has a region two-dimensionally overlapping and connected to comb-shaped portion 5A10 and a region extending leftward in FIG. 10.

Figure 11:
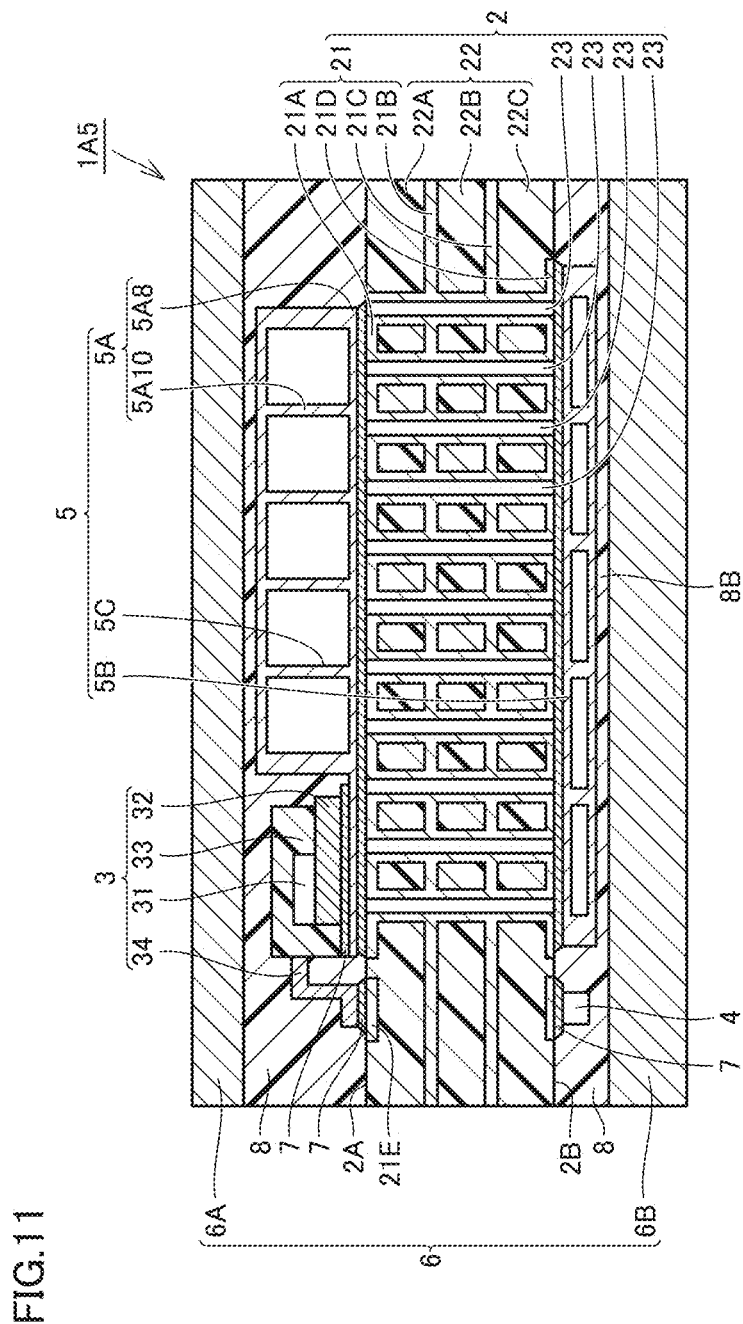
FIG. 11 is a schematic cross-sectional view showing a configuration of the circuit device according to a fifth example of the first embodiment.
Figure 12:
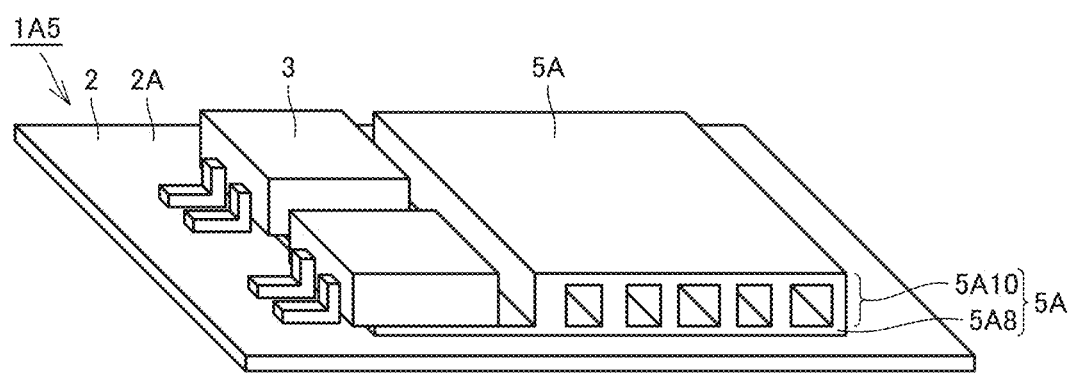
FIG. 12 is a schematic perspective view showing a configuration of the circuit device according to a fifth example of the first embodiment, with a focus on a part including the mounted components and the non-solid metal spacer.

FIG. 11 is a schematic cross-sectional view showing a configuration of a circuit device according to a fifth example of the first embodiment. FIG. 12 is a schematic perspective view showing a configuration of the circuit device according to the fifth example of the first embodiment, with a focus on a part including the mounted components and the non-solid metal spacer. Referring to FIG. 11 and FIG. 12, circuit device 1A5 in the fifth example of the present embodiment basically has a configuration similar to circuit device 1A1 (see FIG. 1) in the first example, and the same constituent elements are denoted by the same reference signs and will not be further elaborated. In circuit device 1A5, however, metal spacer 5A having comb-shaped portion 5A10 and metal flat plate 5A8 in FIG. 10 is connected on one main surface 2A of printed circuit board 2. More specifically, the portion of metal flat plate 5A8 forming metal spacer 5A is connected on one main surface 2A by solder layer 7. Metal flat plate 5A8 of metal spacer 5A is therefore bonded to conductor layer 21A with solder layer 7 interposed.

Metal flat plate 5A8 of metal spacer 5A of circuit device 1A5 extends from the region two-dimensionally overlapping comb-shaped portion 5A8 to the region on the outside as described above. Metal flat plate 5A8 therefore two-dimensionally overlaps semiconductor component 3 in the region outside the region two-dimensionally overlapping comb-shaped portion 5A10. In other words, semiconductor component 3 is installed in the region of metal flat plate 5A8 on the outside of the region two-dimensionally overlapping comb-shaped portion 5A10.

Semiconductor component 3 and metal flat plate 5A8 of metal spacer 5A are connected by solder layer 7 as the second bonding material. More specifically, the upper main surface of metal flat plate 5A8 that does not overlap comb-shaped portion 5A10 is bonded to base plate 32 and resin package 33 of semiconductor component 3 by solder layer 7 as the second bonding material. This solder layer 7 is a layer of a bonding material made of the same material as solder layer 7 serving as the first bonding material extending from the region overlapping comb-shaped portion 5A10 to the region on the left side immediately below metal flat plate 5A8. That is, in the region immediately below semiconductor component 3, metal flat plate 5A8 is sandwiched between solder layers 7 from both of the upper direction and the lower direction.

Circuit device 1A5 having the foregoing configuration achieves the operation effect as follows. Metal flat plate 5A8 of metal spacer 5A is connected to semiconductor component 3, in particular, base plate 32 and resin package 33 through solder layer 7 disposed immediately above metal flat plate 5A8 in FIG. 11. With this configuration, heat generated by semiconductor component 3 can be transmitted to metal spacer 5A through the above-noted solder layer 7 efficiently, that is, quickly.

The present embodiment can further employ other modifications below. The modifications will be described below.

First, for example, metal spacers 5A and 5B may be formed of aluminum. In this case, it is more preferable that the surfaces of metal spacers 5A and 5B are plated, for example, with copper and thereafter they are bonded to printed circuit board 2 by solder layers 7, rather than bonding metal spacers 5A and 5B to printed circuit board 2 by aluminum solder.

Secondly, in the configuration above, the interior of the cylindrical through hole 23 may be hollow. However, the interior of cylindrical through hole 23 may be filled with a plating film or a solder. Particularly when the interior of through hole 23 is filled with a plating film, the air does not enter the interior of through hole 23. Thus, even when metal spacers 5A and 5B are connected on one main surface 2A and on the other main surface 2B of printed circuit board 2 by a reflow process, voids otherwise produced by expansion of the air in through holes 23 can be prevented. In addition, when solder layers 7 are present to connect printed circuit board 2 to coolers 6A and 6B, poor connection due to intrusion of voids in solder layers 7 can be suppressed.

Thirdly, in the configuration above, the distance between metal spacer 5A and base plate 32 may be reduced and they may be connected directly by solder layer 7. This configuration can reduce the thermal resistance between metal spacers 5A, 5B and semiconductor component 3. Heat generated by semiconductor component 3 therefore can be efficiently transmitted to coolers 6A and 6B.

Fourthly, on the surfaces of metal spacers 5A and 5B, a thin insulating layer may be formed using, for example, a thermal conductive resin and an oxide coating. In this case, even if voids caused by the air intrudes into resin layers 8 or metal spacers 5A and 5B come into contact with coolers 6A and 6B, the electrical insulation between printed circuit board 2 and cooler 6 can be kept.

Fifthly, in FIG. 11, solder layer 7 serving as the second bonding material connecting base plate 32 of semiconductor component 3 to metal flat plate 5A8 of metal spacer 5A may be a material different from solder layer 7 serving as the first bonding material connecting conductor layer 21A of printed circuit board 2 to metal flat plate 5A8. For example, it is preferable that before the reflow process, as the second bonding material, a high-temperature solder that does not melt during the reflow process or a conductive adhesive is used as solder layer 7 of the second bonding material. For example, this can prevent displacement of semiconductor component 3 due to the reflow process of solder layer 7 serving as the first bonding material. Conversely, a high-temperature solder or the like is used only for solder layer 7 serving as the first bonding material connecting conductor layer 21 of printed circuit board 2 to metal flat plate 5A8, whereas a solder that is not a high-temperature solder and may melt during the reflow process may be used for the second bonding material.

Second Embodiment

Figure 13:
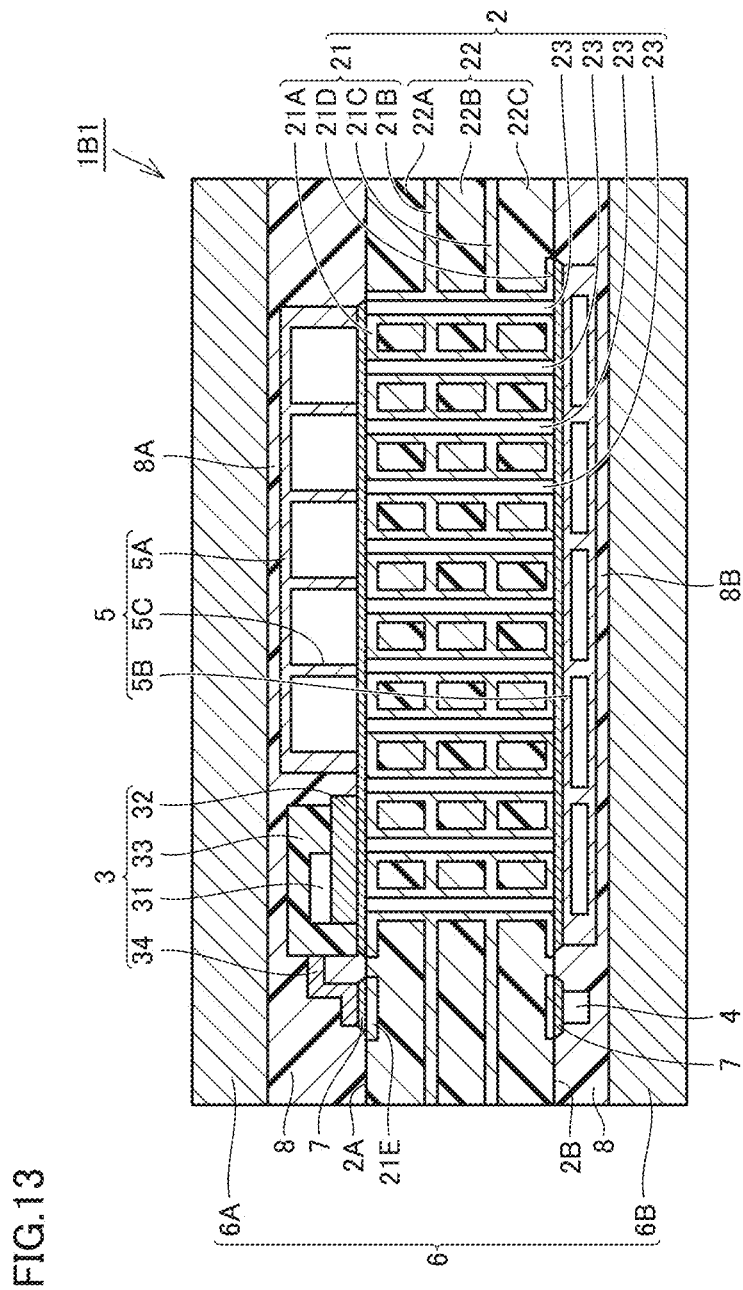
FIG. 13 is a schematic cross-sectional view showing a configuration of the circuit device according to a first example of a second embodiment.
Figure 14:
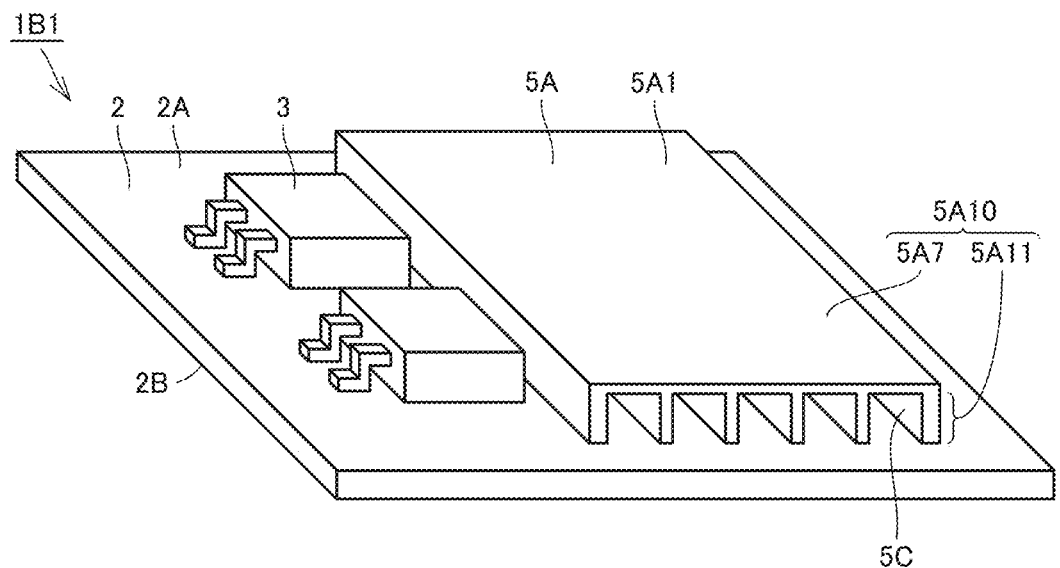
FIG. 14 is a schematic perspective view showing a first example of the configuration of the circuit device according to the second embodiment, with a focus on a part including the mounted components and the non-solid metal spacer.
Figure 15:
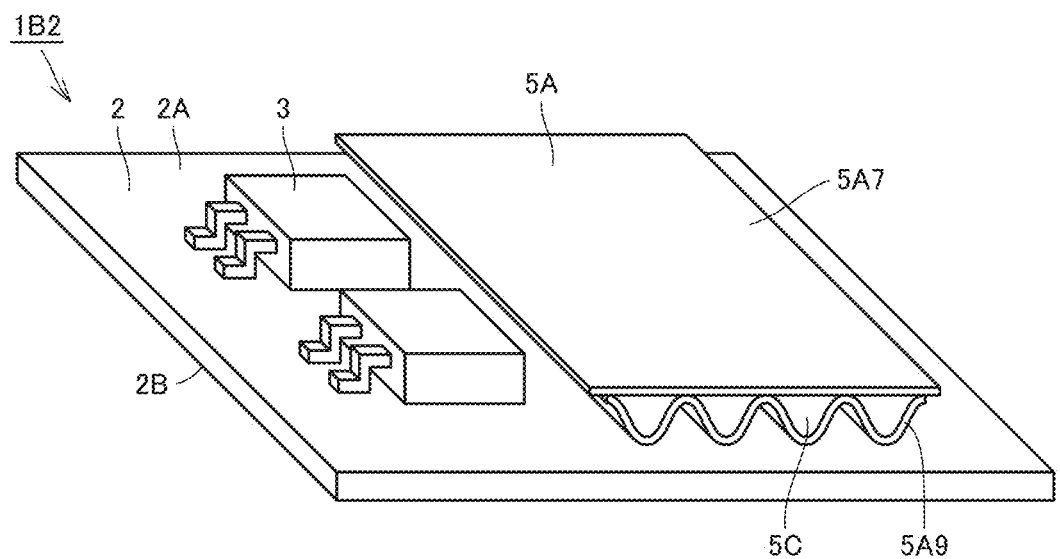
FIG. 15 is a schematic perspective view showing a second example of the configuration of the circuit device according to the second embodiment, with a focus on a part including the mounted components and the non-solid metal spacer.
Figure 16:
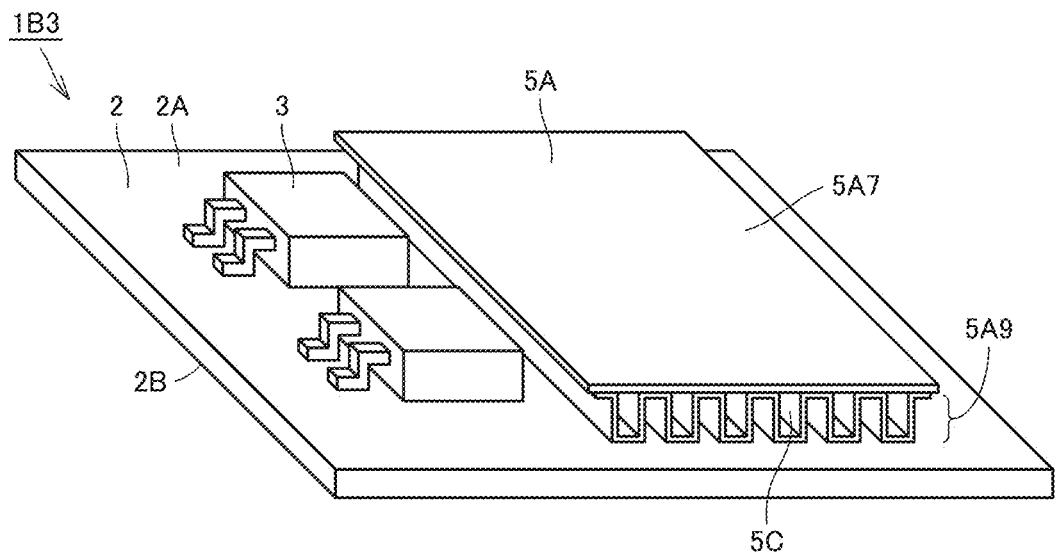
FIG. 16 is a schematic perspective view showing a third example of the configuration of the circuit device according to the second embodiment, with a focus on a part including the mounted components and the non-solid metal spacer.

First of all, a configuration of a circuit device in the present embodiment is described with reference to FIG. 13 to FIG. 16. FIG. 13 is a schematic cross-sectional view showing a configuration of a circuit device according to a first example of a second embodiment. FIG. 14 to FIG. 16 are schematic perspective views showing a configuration of the circuit device according to the second embodiment, with a focus on a part including the mounted components and the non-solid metal spacer. The manner of metal spacer 5A in FIG. 14 corresponds to the manner of metal spacer 5A in FIG. 13. FIG. 15 and FIG. 16 illustrate metal spacer 5A as a modification to metal spacer 5A in FIG. 14 and generally correspond to FIG. 5 and FIG. 6 in the first embodiment.

Referring to FIG. 13, circuit device 1B1 in the first example of the present embodiment basically has a configuration similar to circuit device 1A1 in FIG. 1 in the first embodiment, and the same constituent elements are denoted by the same reference signs and will not be further elaborated. In circuit device 1B1, however, hollow portions 5C of metal spacer 5A are formed to have a portion of the metal wall along one main surface 2A that forms the body of metal spacer 5A, only on the upper side (cooler 6A side). In this respect, circuit device 1B1 differs in configuration from circuit device 1A1 formed such that hollow portions 5C of metal spacer 5A are formed to have portions of the metal wall along one main surface 2A that forms the body of metal spacer 5A, on both the upper side (cooler 6A side) and the lower side (printed circuit board 2 side).

Specifically, in metal spacer 5A shown in FIG. 13, a flat tube 5A1 of metal spacer 5A has a portion of metal flat plate 5A7 serving as a first portion extending in the direction along one main surface 2A of printed circuit board 2, as shown in FIG. 14 as an example. Metal spacer 5A in FIG. 13 and FIG. 14 has split portions 5A11 serving as a plurality of second portions extending from metal flat plate 5A7 in the direction intersecting one main surface 2A (the direction from metal flat plate 5A7 toward printed circuit board 2) and disposed at a distance in the width direction from each other with respect to the direction along one main surface 2A. Metal flat plate 5A7 and split portions 5A11 in FIG. 13 form the aforementioned comb-shaped portion 5A10 in FIG. 10. The bottom portions of a plurality of split portions 5A11, that is, the tip ends of split portions 5A11 are directly bonded to printed circuit board 2. Split portions 5A11 are bonded to conductor layer 21A of printed circuit board 2, for example, with solder layer 7 interposed.

In other words, metal spacer 5A in circuit device 1B1 in FIG. 13 and FIG. 14 does not have a portion disposed on the printed circuit board 2 side and extending along printed circuit board 2 but has a comb-shaped portion in metal spacer 5A in FIG. 1 and FIG. 2 (FIG. 3 and FIG. 4). In metal spacer 5A in FIG. 13 and FIG. 14, a portion sandwiched between a pair of adjacent split portions 5A11 of a plurality of split portions 5A11 has a distance in the width direction and is enclosed by printed circuit board 2 and metal flat plate 5A7 to form hollow portion 5C.

Referring to FIG. 15, metal spacer 5A in this circuit device 1B2 basically has a configuration similar to metal spacer 5A in FIG. 5 but differs in that it does not have metal flat plate 5A8. More specifically, corrugated metal plate 5A9 in FIG. 15 is directly bonded to printed circuit board 2, for example, with solder layer 7 interposed, in the same manner as split portions 5A11 in FIG. 14. Hollow portions 5C are formed with corrugated metal plate 5A9 as well as metal flat plate 5A7 and printed circuit board 2 sandwiching corrugated metal plate 5A9 from the upper and lower sides. That is, in metal spacer 5A in this example, metal flat plate 5A7 is disposed as the first portion, and corrugated metal plate 5A9 is disposed as the second portion.

Referring to FIG. 16, metal spacer 5A in this circuit device 1B3 basically has a configuration similar to metal spacer 5A in FIG. 6 but differs in that it does not have metal flat plate 5A8. More specifically, rectangular corrugated metal plate 5A9 in FIG. 16 is directly bonded to printed circuit board 2, for example, with solder layer 7 interposed, in the same manner as in split portions 5A11 in FIG. 14. Hollow portions 5C are formed with corrugated metal plate 5A9 as well as metal flat plate 5A7 and printed circuit board 2 sandwiching corrugated metal plate 5A9 from the upper and lower sides. That is, in metal spacer 5A in this example, metal flat plate 5A7 is disposed as the first portion, and corrugated metal plate 5A9 is disposed as the second portion.

The description above is given for metal spacer 5A but applicable to metal spacer 5B.

The operation effects of the present embodiment will now be described.

In circuit devices 1B1 to 1B3 in the present embodiment, heat generated from semiconductor component 3 is transmitted to conductor layer 21A and transmitted from the tip ends of split portions 5A11 of metal spacer 5A connected to conductor layer 21A to the entire metal spacer 5A. The heat is further transmitted from metal spacer 5A to cooler 6A through resin layer 8. In this way, metal spacer 5A in the present embodiment functions as a heat spreader on one main surface 2A of printed circuit board 2 and a thermal bridge between cooler 6A and printed circuit board 2, in the same manner as in the first embodiment. Metal spacer 5A can function as a thermal diffusion plate that spreads heat of printed circuit board 2 in the direction along one main surface 2A. Heat of printed circuit board 2 thus can be transmitted efficiently to cooler 6A through metal spacer 5A. The description above is applicable to metal spacer 5B on the other main surface 2B of printed circuit board 2.

Metal spacers 5A and 5B of circuit devices 1B1 to 1B3 in the present embodiment have comb-shaped portions of which tip ends are directly bonded to printed circuit board 2. In the present embodiment, unlike the first embodiment in which metal spacers 5A and 5B have a portion such as metal flat plate 5A8 along one main surface 2A on the printed circuit board 2 side, metal spacer 5 does not close through holes 23 provided in printed circuit board 2. In this configuration, even if the air in the interior of through holes 23 expand during the reflow process, the air can be exhausted from the ends in the extending direction of through holes 23 on the metal spacer 5A side. This can prevent poor connection between printed circuit board 2 and metal spacers 5A, 5B due to intrusion of voids in solder layers 7 between printed circuit board 2 and metal spacers 5A, 5B.

Metal spacers 5A and 5B having split portions 5A11 or corrugated metal plate 5A9 as the second portion are pro-
duced by a process method such as press molding. Metal spacers 5A and 5B are formed of a metal material having a high thermal conductivity, such as copper or aluminum, in the same manner as in the first embodiment. The metal material is available inexpensively and easily. Metal spacer 5A in FIG. 16 does not include metal flat plate 5A8 included in metal spacer 5A in FIG. 6. Metal spacer 5A in FIG. 16 therefore can be produced more inexpensively than metal spacer 5A in FIG. 6.

Figure 17:
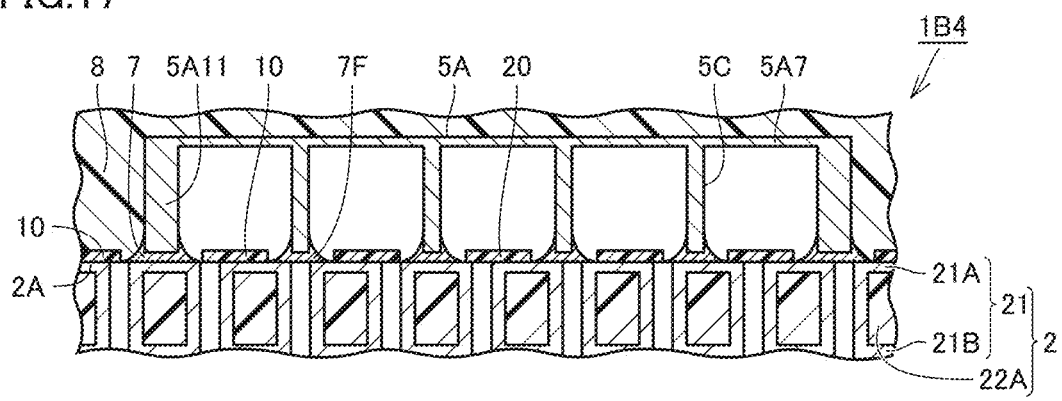
FIG. 17 is a schematic cross-sectional view of the circuit device according to a fourth example of the second embodiment, specifically, in which a partial region of the non-solid metal spacer and the printed circuit board is cut away.

FIG. 17 is a schematic cross-sectional view of a circuit device according to a fourth example of the second embodiment, specifically, in which a partial region of the non-solid metal spacer and the printed circuit board is cut away. Referring to FIG. 17, circuit device 1B4 in the fourth example of the present embodiment basically has a configuration similar to circuit device 1B1 (see FIG. 13 and FIG. 14) in the first example, and the same constituent elements are denoted by the same reference signs and will not be further elaborated. In circuit device 1B4, however, a photoresist layer 20 is formed on a region of conductor layer 21A of printed circuit board 2, excluding the region connected to split portions 5A11 by solder layer 7. Photoresist layer 20 is formed on conductor layer 21A in the interior of hollow portions 5C formed by metal spacer 5A. Photoresist layer 20 is also formed on conductor layer 21A on the outside of metal spacer 5A. Although not shown, photoresist layer 20 may also be formed on conductor layer 21D at a similar position as described above on the metal spacer 5B side.

In the configuration above, solder layer 7 is not formed on the entire surface of conductor layer 21A (21D). Solder layer 7 is disposed on conductor layer 21A (21D), specifically, only at the region connected to the bottom portion of metal spacer 5. Photoresist layer 20 is formed on the surface of a region of conductor layer 21A that does not contribute to connection to metal spacer 5. Solder fillet having a width gradually increasing toward conductor layer 21 is thus formed in solder layer 7 immediately below split portion 5A11 of metal spacer 5. When solder fillet is formed in solder layer 7, the heat dissipation efficiency between metal spacer 5 and conductor layer 21 can be further improved compared with when solder fillet is not formed. Further, the formation of solder fillet in solder layer 7 can prevent displacement of metal spacer 5 from the originally intended position.

For the points other than those described above, the second embodiment is basically similar to the first embodiment and will not be further elaborated here.

Third Embodiment

Figure 18:
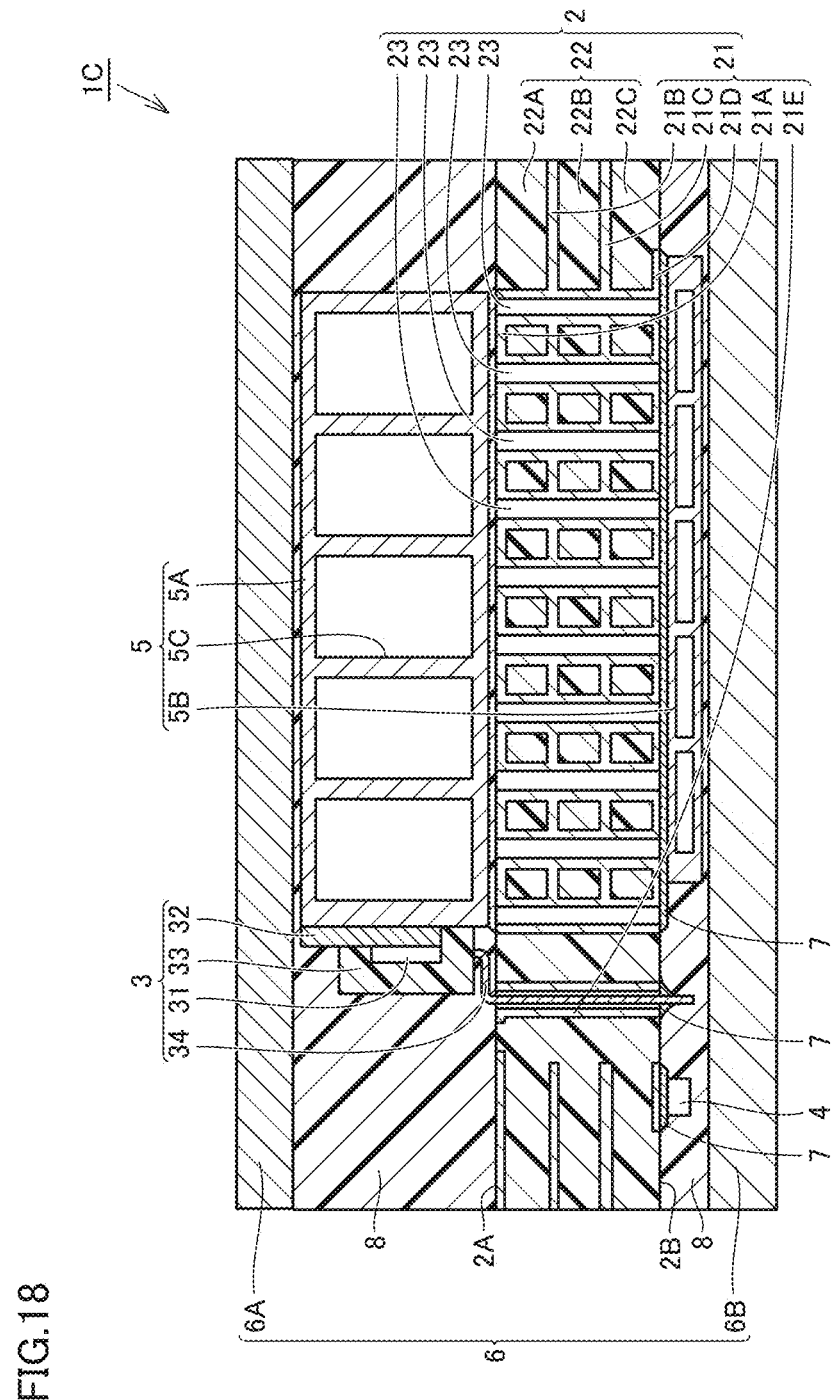
FIG. 18 is a schematic cross-sectional view showing a configuration of the circuit device according to a third embodiment.

First of all, a configuration of a circuit device in the present embodiment is described with reference to FIG. 18. FIG. 18 is a schematic cross-sectional view showing a configuration of a circuit device according to a third embodiment. Referring to FIG. 18, circuit device 1C in the present embodiment basically has a configuration similar to circuit device 1A1 in FIG. 1 in the first embodiment, and the same constituent elements are denoted by the same reference signs and will not be further elaborated. In circuit device 1C, however, semiconductor component 3 is encapsulated in, for example, a general-purpose insertion-mount type IC package such as TO220 or TO-3P. The lower surface of base plate 32 that forms semiconductor component 3 is connected on a surface of the second portion that is the metal wall of metal spacer 5A (a portion extending in the direction intersecting one main surface 2A), for example, by screws. In circuit device 1C, therefore, the entire semiconductor component 3 is bonded in such a manner that it is rotated by about 90° relative to semiconductor component 3 in circuit device 1A1. That is, in circuit device 1C, base plate 32 of semiconductor component 3 extends along the thickness direction of printed circuit board 2. In this respect, circuit device 1C differs from circuit device 1A1 in which the lower surface of base plate 32 is connected on one main surface 2A of printed circuit board 2.

As described above, in circuit device 1C, the entire semiconductor component 3 is rotated relative to semiconductor component 3 in circuit device 1A1. The dimension in the thickness direction of metal spacer 5A bonded on one main surface 2A is increased in accordance with the dimension in the direction in which base plate 32 extends. In circuit device 1C, therefore, hollow portion 5C of metal spacer 5A has a longer dimension in the top-bottom direction intersecting one main surface 2A than the dimension in the right-left direction along one main surface 2A of printed circuit board 2.

Since hollow portion 5C of metal spacer 5A has a longer dimension in the top-bottom direction than the dimension in the right-left direction, the volume of hollow portion 5C is larger accordingly, compared with the other embodiments. In order to avoid increase in thermal resistance in the interior of metal spacer 5A, sidewalls extending in the top-bottom direction are provided also in the present embodiment to provide hollow portions 5C as many as (five) or more than those in the other embodiments.

In circuit device 1C, lead frame 34 included in semiconductor component 3 extends in the direction along base plate 32 (the top-bottom direction in FIG. 18), then is curved and extends in the right-left direction in FIG. 18 along one main surface 2A, and is further curved from there and extends along the thickness direction of printed circuit board 2, as shown in FIG. 9. A part of lead frame 34 extending along the thickness direction of printed circuit board 2 is inserted in the interior of one of a plurality of through holes 23 formed in printed circuit board 2. Lead frame 34 inserted in through hole 23 is electrically connected to conductor layer 21E of printed circuit board 2 by solder layer 7. Lead frame 34 extends in through hole 23 to reach the other main surface 2B of printed circuit board 2 and further extends into resin layer 8 on the lower side in FIG. 18. In this way, lead frame 34 is inserted in through hole 23 whereby semiconductor component 3 is mounted on printed circuit board 2. Semiconductor component 3 is the insertion mount type. In this respect, circuit device 1C differs from circuit devices 1A1 and 1B1 in which lead frame 34 is electrically connected to conductor layer 21E of printed circuit board 2 whereby semiconductor component 3 is mounted on printed circuit board 2, that is, semiconductor component 3 is the surface mount type.

The operation effects of the present embodiment will now be described.

In circuit device 1C, since heat of printed circuit board 2 is transmitted from lead frame 34 of semiconductor component 3 to solder layer 7 bonding lead frame 34 to printed circuit board 2, the surface temperature of solder layer 7 may rise. Even in this case, printed circuit board 2 and semiconductor component 3 can be cooled using metal spacer 5A. Therefore, printed circuit board 2 can be cooled using metal spacers 5A and 5B from either surface on the one main surface 2A side that is the component-mounted surface side of printed circuit board 2 in which lead frame 34 is inserted, and on the other main surface 2B side on the opposite side.

That is, not only in the surface mount-type circuit devices 1A1 and 1B1 as in the first and second embodiments but also in the insertion mount-type circuit device 1C as in the present embodiment, the surfaces on both the one main surface 2A side and the other main surface 2B side of printed circuit board 2 can be efficiently cooled. Circuit device 1C therefore can withstand a heat generation density almost twice as high as when it is cooled only from the one main surface side, without increasing the size of printed circuit board 2.

For the points other than those described above, the third embodiment is basically similar to the first embodiment and will not be further elaborated here.

Fourth Embodiment

Figure 19:
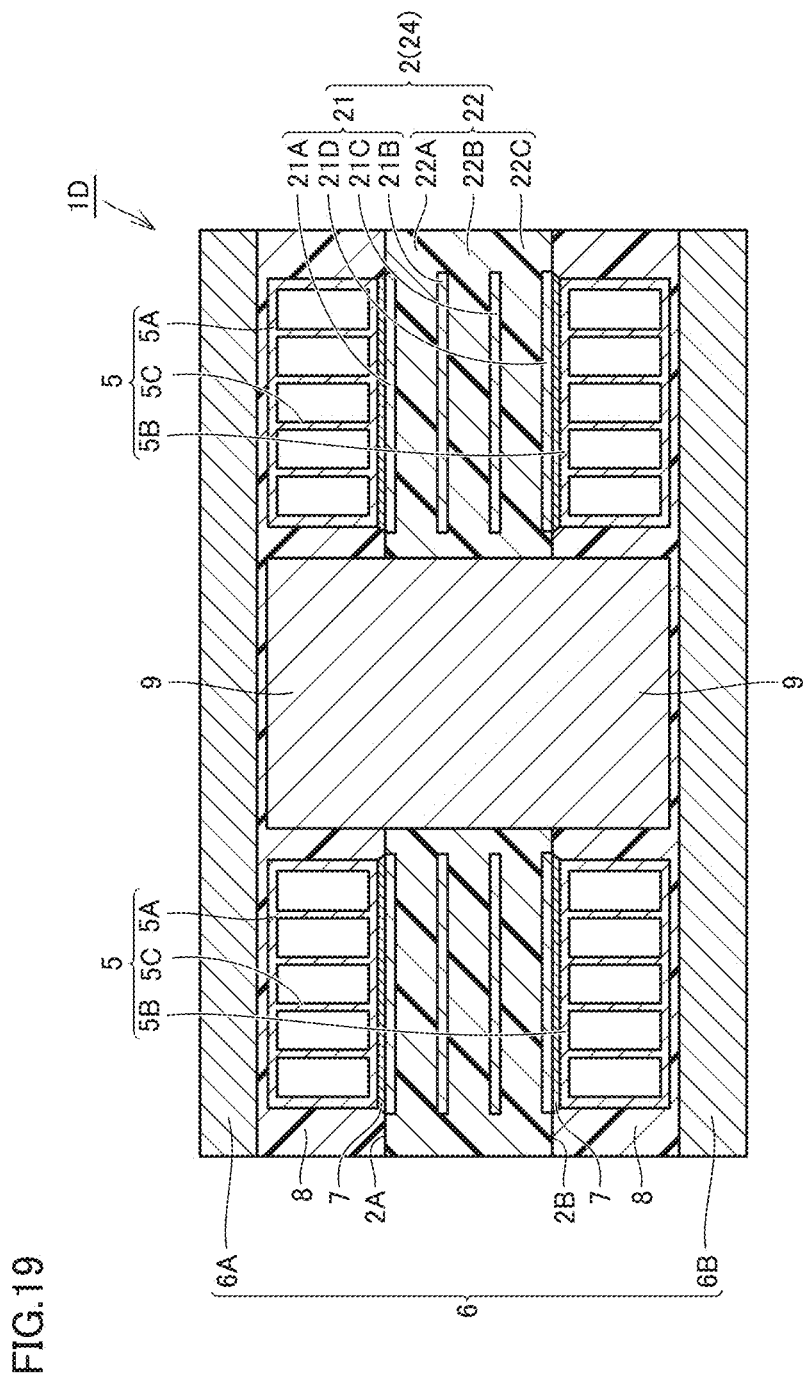
FIG. 19 is a schematic cross-sectional view showing a configuration of the circuit device according to a fourth embodiment.
Figure 20:
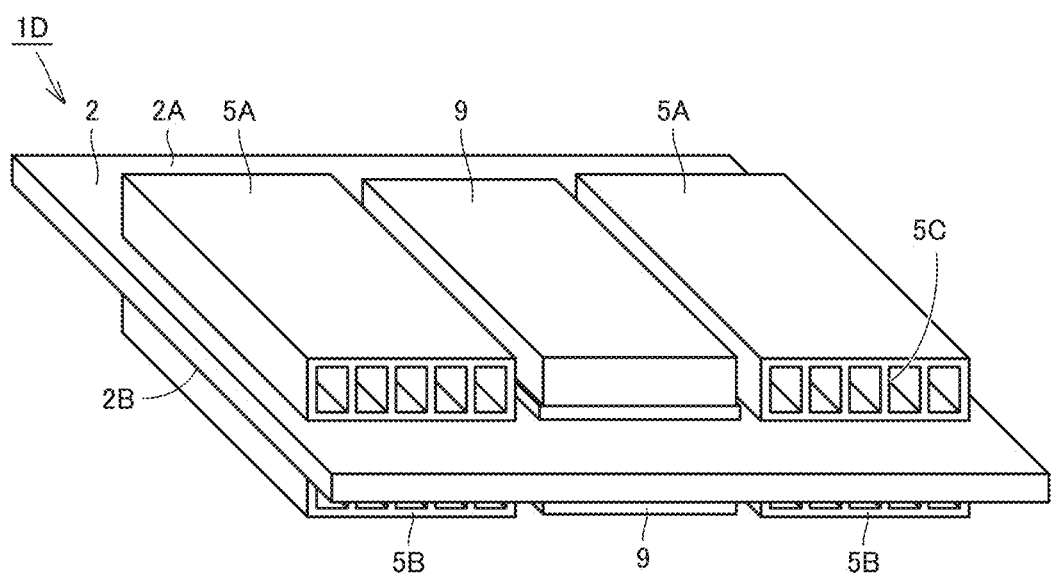
FIG. 20 is a schematic perspective view showing a configuration of the circuit device according to the fourth embodiment, with a focus on a part other than the coolers.

First of all, a configuration of a circuit device in the present embodiment is described with reference to FIG. 19 and FIG. 20. FIG. 19 is a schematic cross-sectional view showing a configuration of a circuit device according to a fourth embodiment. FIG. 20 is a schematic perspective view showing a configuration of the circuit device according to the fourth embodiment, with a focus on a part other than the coolers in the circuit device in FIG. 19. Referring to FIG. 19 and FIG. 20, circuit device 1D in the present embodiment basically has a configuration similar to circuit device 1A1 in FIG. 1 in the first embodiment, and the same constituent elements are denoted by the same reference signs and will not be further elaborated. In circuit device 1D, however, a magnetic component 9 is used as a mounted component instead of semiconductor component 3. Magnetic component 9 serving as a mounted component extends in the top-bottom direction in FIG. 19 from an upper region in the drawing above one main surface 2A of printed circuit board 2 to a lower region in the drawing below the other main surface 2B of printed circuit board 2. As used herein the "upper region in the drawing above one main surface 2A of printed circuit board 2" is a region supplied with resin layer 8 and aligned with metal spacer 5A along one main surface 2A. As used herein the "lower region in the drawing below the other main surface 2B of printed circuit board 2" is a region supplied with resin layer 8 and aligned with metal spacer 5B along the other main surface 2B. That is, magnetic component 9 extends from the region supplied with resin layer 8 and aligned with metal spacer 5A along one main surface 2A, through the interior of printed circuit board 2 from one main surface 2A to the other main surface 2B, to the region supplied with resin layer 8 and aligned with metal spacer 5B along one main surface 2B. Magnetic component 9 thus extends from above one main surface 2A so as to pass through the interior of printed circuit board 2.

Magnetic component 9 is, for example, a magnetic core inserted in a hollow portion of conductor layer 21 and insulating layer 22, of a coil pattern 24 formed with conductor layer 21 and insulating layer 22 of printed circuit board 2. Magnetic component 9 is formed of, for example, ferrite and functions as a transformer and a reactor in combination with coil pattern 24 formed in printed circuit board 2 described above.

In FIG. 19 and FIG. 20, hollow portion 5C of metal spacer 5A, 5B has a longer dimension in the top-bottom direction intersecting one main surface 2A than the dimension in the right-left direction along one main surface 2A of printed circuit board 2, for example, in the same manner as in FIG. 18. However, the embodiment is not limited to such a manner. Also in the present embodiment, hollow portion 5C of metal spacer 5A, 5B may have a longer dimension in the right-left direction along one main surface 2A of printed circuit board 2 than the dimension in the top-bottom direction intersecting one main surface 2A, in the same manner as in the first and second embodiments. In other words, thick metal spacer 5A may be formed such that the top portion of metal spacer 5A is disposed above the top portion of magnetic component 9. Alternatively, thin metal spacer 5A may be formed such that the top portion of metal spacer 5A is disposed below the top portion of magnetic component 9. Similarly, thick metal spacer 5B may be formed such that the bottom portion of metal spacer 5B is disposed below the bottom portion of magnetic component 9. Alternatively, thin metal spacer 5B may be formed such that the bottom portion of metal spacer 5B is disposed above the bottom portion of magnetic component 9.

In FIG. 19, through hole 23 extending so as to pass through printed circuit board 2 from one main surface 2A to the other main surface 2B is not illustrated. However, even in circuit device 1D in FIG. 19, through hole 23 extending from one main surface 2A to the other main surface 2B so as to pass through printed circuit board 2 may be formed in the body of printed circuit board 2 including conductor layer 21 and insulating layer 22, in the same manner as the other embodiments.

The operation effects of the present embodiment will now be described.

In circuit device 1D in the present embodiment, heat generated in coil pattern 24 and the like formed in printed circuit board 2 is transmitted to coolers 6A and 6B via magnetic component 9. The heat is also transmitted to coolers 6A and 6B via metal spacers 5A and 5B. In circuit device 1D, therefore, printed circuit board 2 can be efficiently cooled without increasing the size of printed circuit board 2.

For the points other than those described above, the fourth embodiment is basically similar to the first embodiment and will not be further elaborated here.

Fifth Embodiment

Figure 21:
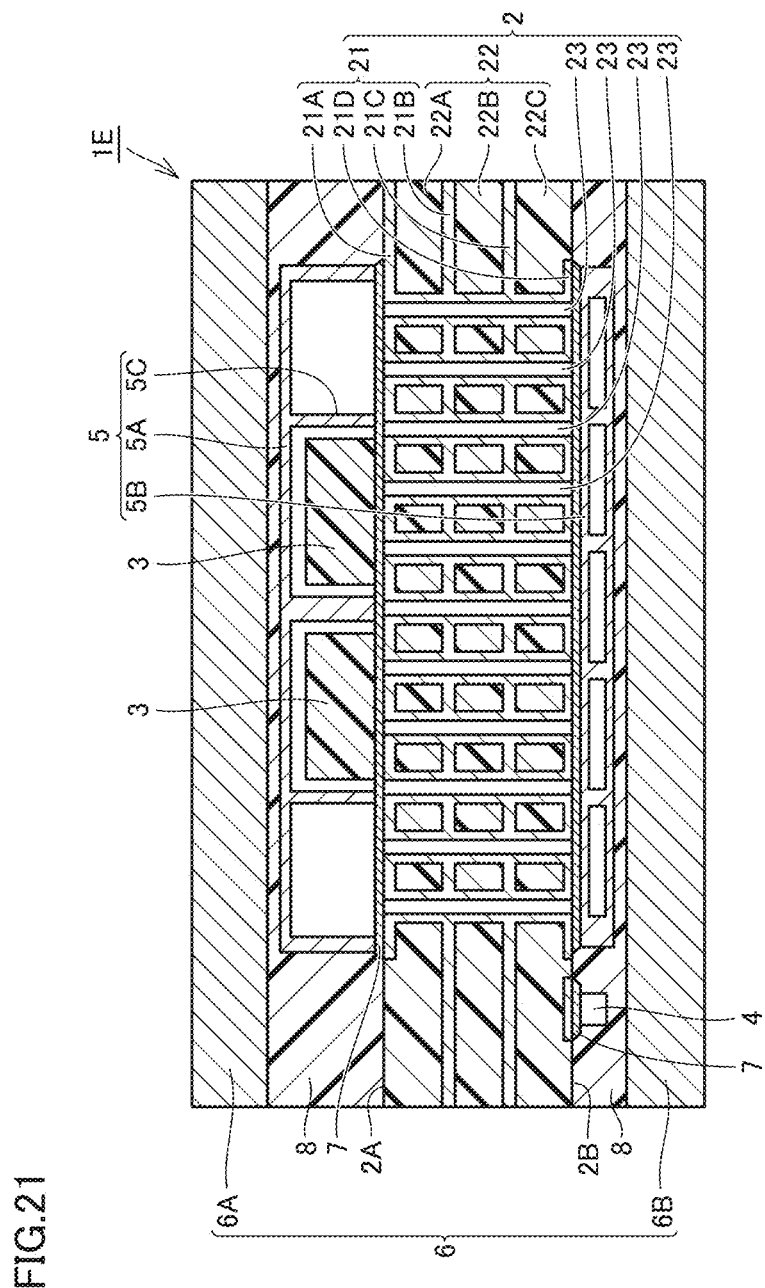
FIG. 21 is a schematic cross-sectional view showing a configuration of the circuit device according to a fifth embodiment.
Figure 22:
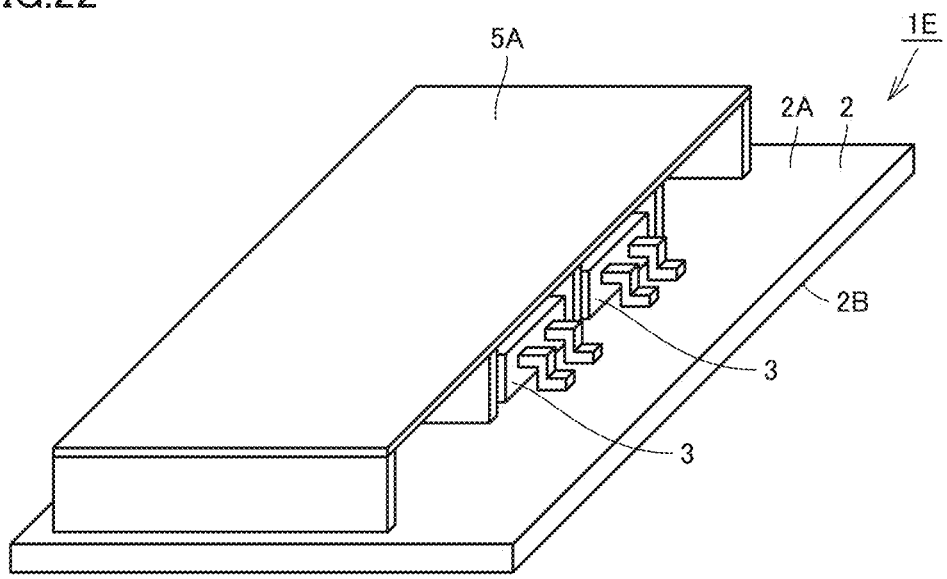
FIG. 22 is a schematic perspective view showing a configuration of the circuit device according to the fifth embodiment, with a focus on a part including the mounted components and the non-solid metal spacer.

First of all, a configuration of a circuit device in the present embodiment is described with reference to FIG. 21 and FIG. 22. FIG. 21 is a schematic cross-sectional view showing a configuration of a circuit device according to a fifth embodiment. FIG. 22 is a schematic perspective view showing a configuration of the circuit device according to the fifth embodiment, with a focus on a part including the mounted components and the non-solid metal spacer. Referring to FIG. 21 and FIG. 22, circuit device 1E in the present embodiment basically has a configuration similar to circuit device 1B1 in FIG. 13 in the second embodiment, and the same constituent elements are denoted by the same reference signs and will not be further elaborated. In circuit device 1E, however, semiconductor component 3 serving as a mounted component is disposed in hollow portion 5C of metal spacer 5A. In this respect, circuit device 1E differs in configuration from the first to fourth embodiments in which semiconductor component 3 is disposed on the outside of hollow portion 5C on one main surface 2A.

In the present embodiment, it is preferable that metal spacer 5A is bonded on one main surface 2A in hollow portion 5C. In order to allow for this, it is preferable that metal spacer 5A in the present embodiment has a portion of the metal wall only on the upper side of hollow portion 5C (the cooler 6A side) in the same manner as in the second embodiment. That is, it is preferable that the tip ends of split portions 5A11 are directly bonded to printed circuit board 2.

The operation effects of the present embodiment will now be described.

The Operation Effects of the Present Embodiment Will Now be Described

In the present embodiment, semiconductor component 3 is disposed in hollow portion 5C of metal spacer 5A. Semiconductor component 3 is thus not disposed on the outside of metal spacer 5A. Therefore, the entire region filled with resin layer 8 with respect to the top-bottom direction in FIG. 21 from printed circuit board 2 to cooler 6A is larger than in the first to fourth embodiments. In the present embodiment, therefore, the base portion of metal spacer 5A with an area larger than in the first to fourth embodiments can be used for connection from one main surface 2A of printed circuit board 2 to cooler 6A through resin layer 8. In this way, in circuit device 1E, heat can be efficiently transmitted from printed circuit board 2 to cooler 6A. It is therefore possible to provide circuit device 1E that can withstand increase in output power, without increasing the size of printed circuit board 2.

In the present embodiment, semiconductor component 3 is covered with metal spacer 5A from above. In this configuration, metal spacer 5A enclosing a mounted component such as semiconductor component 3 also provides the effect of suppressing radiation of electromagnetic noise from the mounted component to the outside.

In the configuration above, semiconductor component 3 is disposed in hollow portion 5C of metal spacer 5A. However, the embodiment is not limited thereto. Another mounted component, for example, a capacitor or a resistor may be disposed in hollow portion 5C. For example, electronic component 4 may be disposed in hollow portion 5C of metal spacer 5B.

Sixth Embodiment

Figure 23:
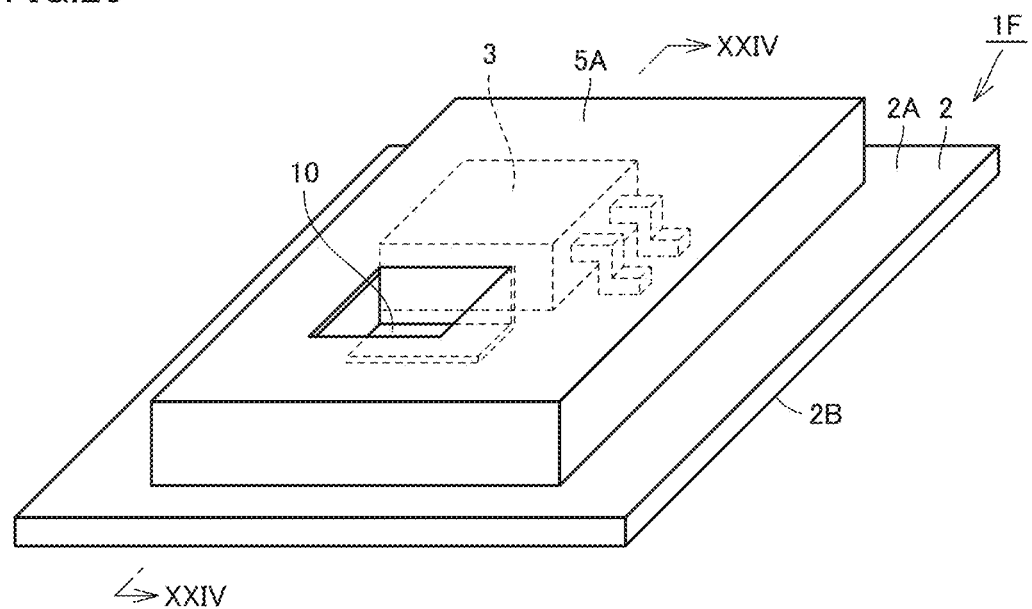
FIG. 23 is a schematic perspective view showing a configuration of the circuit device according to a sixth embodiment, with a focus on a part including the mounted components and the non-solid metal spacer.
Figure 24:
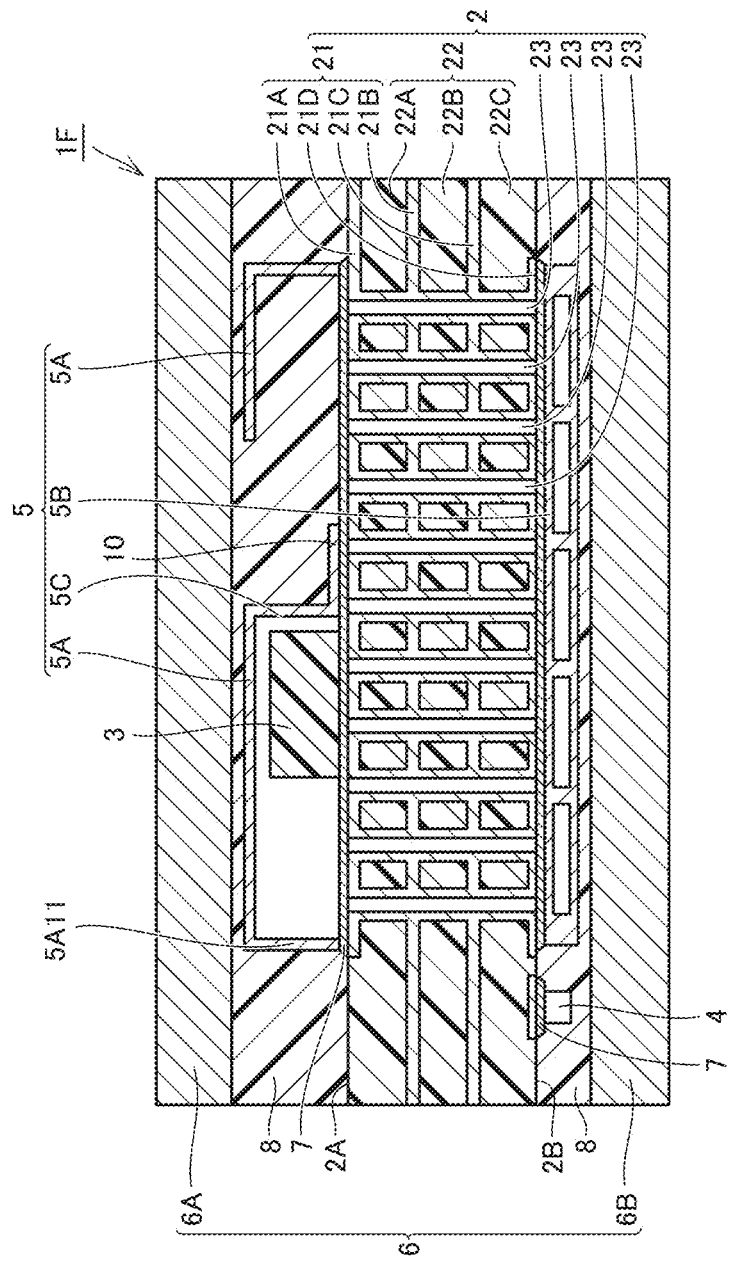
FIG. 24 is a schematic cross-sectional view showing a configuration of the circuit device according to the sixth embodiment.

First of all, a configuration of a circuit device in the present embodiment is described with reference to FIG. 23 and FIG. 24. FIG. 23 is a schematic perspective view showing a configuration of the circuit device according to a sixth embodiment, with a focus on a part including the mounted components and the non-solid metal spacer. FIG. 24 is a schematic cross-sectional view showing a configuration of the circuit device according to the sixth embodiment. In other words, FIG. 24 illustrates the configuration of the circuit device taken along line XXIV-XXIV in FIG. 23, as a whole including coolers 6A and 6B.

Referring to FIG. 23, circuit device 1F in the present embodiment basically has a configuration similar to circuit device 1B1 in the second embodiment and circuit device 1E in the fifth embodiment. The same constituent parts as the foregoing embodiments are denoted by the same reference signs and will not be further elaborated. In circuit device 1F, however, a cut portion 10 is formed by cutting out a part of metal spacer 5A having a comb-shaped portion in the same manner as in the second embodiment. In this respect, the present embodiment differs in configuration from other embodiments not having such cut portion 10 of metal spacer 5A.

Specifically, referring to FIG. 24, cut portion 10 is formed, for example, by cutting out a portion of the metal wall along one main surface 2A that forms the body of metal spacer 5A, on the upper side of hollow portion 5C of metal spacer 5A (the cooler 6A side). As shown in FIG. 24, the portion of the metal wall on the top surface of the cut metal spacer 5A is bent to form a side wall of metal spacer 5A and a portion bonded to one main surface 2A below. Cut portion 10 is thus formed. In this way, cut portion 10 is formed such that a part of metal spacer 5A is bent to form split portion 5A11 (see FIG. 14) of metal spacer 5A, and is bonded to printed circuit board 2 with solder layer 7 interposed, for example. In this configuration, metal spacer 5A having split portion 5A11 is formed in the same manner as in the second and fifth embodiments.

As shown in the cross-sectional view in FIG. 24, cut portion 10 may be bent in the shape of a letter L to form hollow portion 5C of metal spacer 5A. As shown in the cross-sectional view in FIG. 24, a portion that is disposed on the outside of cut portion 10 and forms a sidewall of hollow portion 5C of metal spacer 5A before cutting may be bent at about 90° such that the top surface, the side surface, and the bottom surface are integrated.

As shown in FIG. 24, also in the present embodiment, it is preferable that semiconductor component 3 is disposed in hollow portion 5C of metal spacer 5A in the same manner as in the fifth embodiment. In this way, metal spacer 5A achieves the effect of suppressing radiation of electromagnetic noise from the mounted component such as semiconductor component 3 to the outside, in the same manner as in the fifth embodiment.

The operation effects of the present embodiment will now be described.

In circuit device 1F having cut portion 10 as in the present embodiment, heat transmitted from semiconductor component 3 to printed circuit board 2 is transmitted to metal spacer 5A through cut portion 10. The interior of metal spacer 5A includes a region as a closed space to form hollow portion 5C and a region not closed by the metal wall and embedded in resin layer 8, like a region on the right side of hollow portion 5C in FIG. 24. Heat spread to hollow portion 5C is thus transmitted to cooler 6A through resin layer 8 in the region not closed by the metal wall but embedded in resin layer 8. In this way, circuit device 1F has a larger proportion of the area occupied by resin layer 8 in a two-dimensional view, compared with the other embodiments. In circuit device 1F, therefore, heat can be efficiently transmitted from printed circuit board 2 to cooler 6A, using a high thermal conductivity of resin layer 8. It is therefore possible to provide circuit device 1F that can withstand increase in output power, without increasing the size of printed circuit board 2.

Cut portion 10 described above is not limited to metal spacer 5A and may be formed in metal spacer 5B.

Seventh Embodiment

Figure 25:
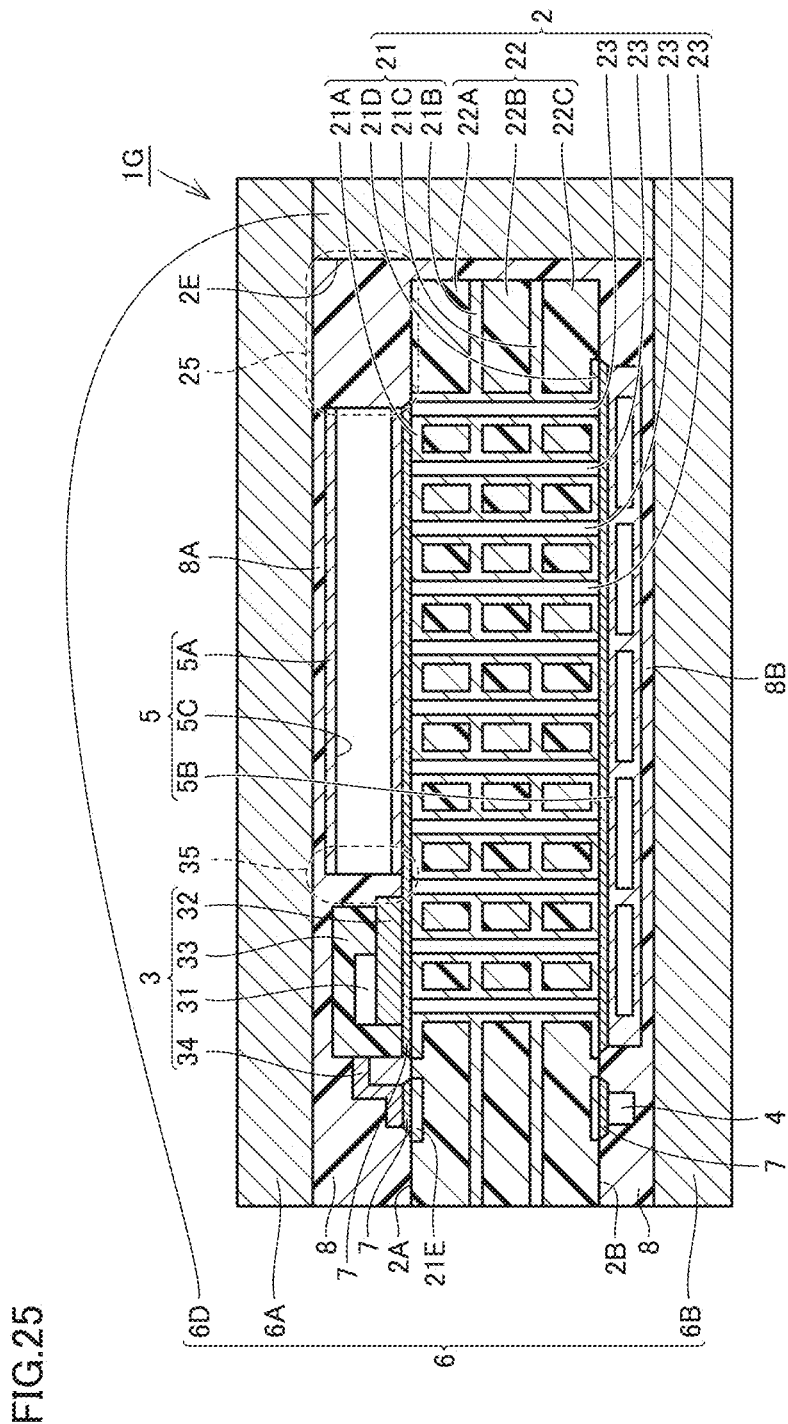
FIG. 25 is a schematic cross-sectional view showing a configuration of the circuit device according to a seventh embodiment.
Figure 26:
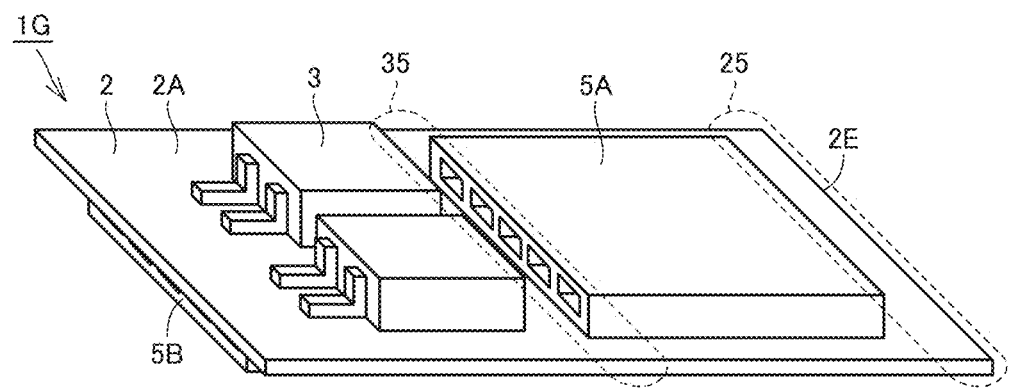
FIG. 26 is a schematic perspective view showing a configuration of the circuit device according to the seventh embodiment, with a focus on a part including the mounted components and the non-solid metal spacer.

FIG. 25 is a schematic cross-sectional view showing a configuration of a circuit device according to a seventh embodiment. FIG. 26 is a schematic perspective view showing a configuration of the circuit device according to the seventh embodiment, with a focus on a part including the mounted components and the non-solid metal spacer. Referring to FIG. 25 and FIG. 26, circuit device 1G in the present embodiment basically has a configuration similar to circuit device 1A1 in the first embodiment, and the same constituent elements are denoted by the same reference signs and will not be further elaborated. In circuit device 1G, however, hollow portion 5C extends in the right-left direction in FIG. 25 and FIG. 26 so as to extend along one main surface 2A from a region 35 adjacent to semiconductor component 3 to a region 25 adjacent to an end surface 2E of printed circuit board 2. That is, metal spacers 5A, 5B have a plurality of hollow portions 5C extending in a columnar shape so as to pass through in the right-left direction of FIG. 25 and FIG. 26. A plurality of hollow portions 5C are therefore formed so as to be spaced apart from each other with respect to the depth direction in FIG. 25 and FIG. 26.

As shown in FIG. 25, in circuit device 1G, cooler 6 includes a cooler connecting portion 6D in addition to cooler 6A and cooler 6B. Cooler connecting portion 6D extends in the top-bottom direction (thickness direction) in FIG. 25 intersecting one main surface 2A so as to connect the end portions of cooler 6A and cooler 6B. As used herein the end portions of cooler 6A and cooler 6B are the rightmost region in FIG. 25. That is, in FIG. 25, the end surfaces serving as the top surface and the bottom surface of cooler connecting portion 6D are connected to the rightmost region of the bottom surface of cooler 6A that faces cooler 6B and to the rightmost region of the top surface of cooler 6B that faces cooler 6A.

Cooler connecting portion 6D is a separate part from cooler 6A and cooler 6B, and the end surfaces serving as the top surface and the bottom surface of cooler connecting portion 6D may be connected to the end portion of the bottom surface of cooler 6A and the end portion of the top surface of cooler 6B. In this case, as shown in FIG. 25, cooler connecting portion 6D is disposed between cooler 6A and cooler 6B with respect to the top-bottom direction in FIG. 25. Alternatively, cooler connecting portion 6D may be formed to be integrated with cooler 6A and cooler 6B and have the shape shown in FIG. 25. As another modification, although not shown, for example, a side surface facing the left side in FIG. 25 of cooler connecting portion 6D extending in the top-bottom direction in FIG. 25 may be connected to the end surfaces on the rightmost side of cooler 6A and cooler 6B. In this case, cooler connecting portion 6D as a whole is disposed on the right side in FIG. 25 to cooler 6A and cooler 6B.

For the configuration above, in circuit device 1G, hollow portion 5C extends in the right-left direction in FIG. 25 and FIG. 26 along one main surface 2A from region 35 adjacent to semiconductor component 3 to region 25 adjacent to cooler connecting portion 6D. In this way, the present embodiment differs in the direction in which hollow portion 5C extends, from the configuration in the first to sixth embodiments in which hollow portion 5C extends in the direction intersecting the direction connecting region 35 and region 25.

Coolers 6A and 6B in the present embodiment may be metal plates of, for example, copper or aluminum which is a material with a high thermal conductivity. However, coolers 6A and 6B in the present embodiment may be ceramic plates, for example, of aluminum nitride. Coolers 6A and 6B in the present embodiment may be thermal diffusion plates with heat pipe or vapor chamber. Alternatively, coolers 6A and 6B in the present embodiment may be a combination of plates of the materials above. In this way, coolers 6A and 6B in the present embodiment are auxiliary coolers of various kinds. By contrast, cooler connecting portion 6D in the present embodiment is the main cooler, for example, by air cooling or water cooling. Cooler connecting portion 6D may also be formed of the materials described above similar to coolers 6A and 6B. Coolers 6A and 6B in the circuit devices in the foregoing first to sixth embodiments may also be formed of the material described above similar to coolers 6A and 6B in the present embodiment.

Coolers 6A and 6B are connected to cooler connecting portion 6D serving as the main cooler. In this configuration, heat transmitted to coolers 6A and 6B is conducted through the interior of coolers 6A and 6B and then transmitted to cooler connecting portion 6D. The amount of heat transmitted from metal spacer 5 on the farther side from cooler connecting portion 6D, of metal spacers 5A and 5B, to one of coolers 6A and 6B is thereby reduced. Accordingly, more heat can be transmitted from metal spacer 5 on the closer side to cooler connecting portion 6D, of metal spacers 5A and 5B, to one of coolers 6A and 6B. Semiconductor component 3 and printed circuit board 2 thus can be efficiently cooled.

In the arrangement of circuit device 1G in FIG. 25, as an example, the direction in which hollow portion 5C extends in circuit device 1A1 is rotated by about 90° in a two-dimensional view. However, the embodiment is not limited thereto, and the direction in which hollow portions 5C of coolers 6A and 6B extend in the circuit devices in the forgoing first to sixth embodiments may be oriented in a direction similar to that in FIG. 25.

In circuit device 1G in FIG. 25 and FIG. 26, hollow portion 5C of metal spacer 5A and hollow portion 5C of metal spacer 5B extend substantially in the same direction in a two-dimensional view. More specifically, in circuit device 1G, both of hollow portion 5C of metal spacer 5A and hollow portion 5C of metal spacer 5B extend in the right-left direction in the drawing. However, only one of hollow portions 5C of metal spacers 5A and 5B may extend in the right-left direction in FIG. 25 and FIG. 26, and the other may extend in the depth direction in the drawing sheet in FIG. 25 and FIG. 26. That is, hollow portion 5C of metal spacer 5A and hollow portion 5C of metal spacer 5B may intersect, for example, orthogonally to each other in a two-dimensional view.

The operation effects of the present embodiment will now be described.

In the present embodiment, hollow portion 5C extends along one main surface 2A from region 35 adjacent to the mounted component to 25 adjacent to end surface 2E of printed circuit board 2 (adjacent to cooler connecting portion 6D). Here, in general, non-solid metal spacers 5A and 5B have a higher thermal conductivity in the direction in which hollow portion 5C extends in a two-dimensional view than in the direction orthogonal to the direction in which hollow portion 5C extends in a two-dimensional view. That is, non-solid metal spacers 5A and 5B have thermal conduction anisotropy. Therefore, in circuit device 1G in which hollow portion 5C extends from region 35 to region 25 as in the present embodiment, heat generated in semiconductor component 3 can be transmitted from region 35 to region 25 with higher efficiency. In circuit device 1G with this configuration, heat can be transmitted efficiently from metal spacers 5A and 5B to coolers 6A and 6B. In circuit device 1G, therefore, the gradient of temperature distribution of metal spacer 5 is reduced.

Eighth Embodiment

In the present embodiment, the circuit device according to the foregoing first to seventh embodiments is applied to a power conversion device. Although the present invention is not limited to a specific power conversion device, a case where the present invention is applied to a three-phase inverter will be described below as an eighth embodiment.

Figure 27:
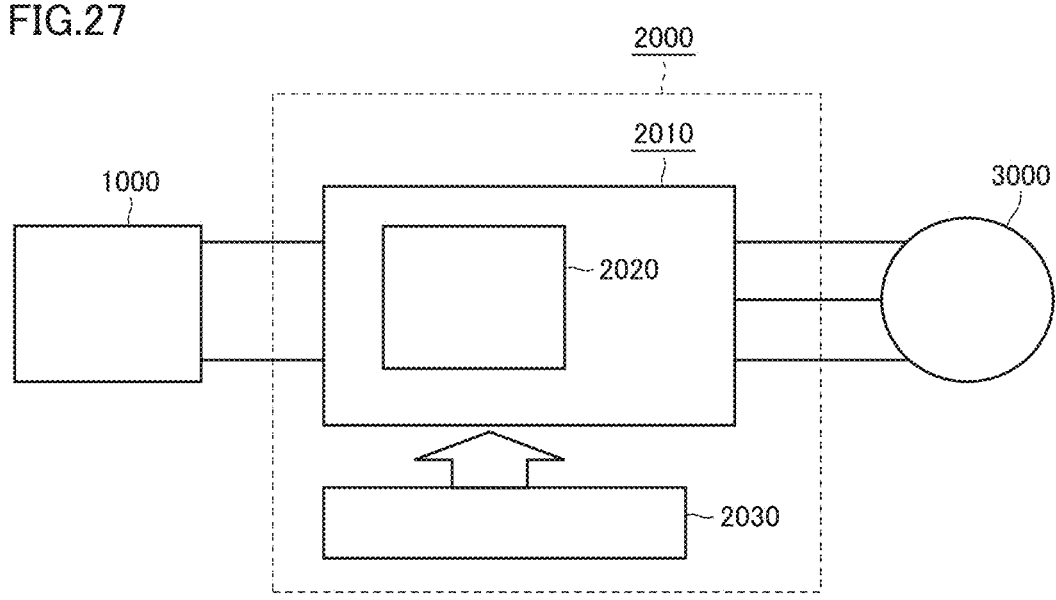
FIG. 27 is a block diagram schematically showing a configuration of a power conversion system to which a power conversion device according to an eighth embodiment is applied.

FIG. 27 is a block diagram showing a configuration of a power conversion system to which a power conversion device according to the present embodiment is applied. A power conversion system shown in FIG. 27 includes a power supply 1000, a power conversion device 2000, and a load 3000. Power supply 1000 is a DC power supply and supplies DC power to power conversion device 2000. Power supply 1000 can be configured with various kinds and, for example, may be configured with a DC system, a solar cell, and a storage battery or may be configured with a rectifying circuit or an AC/DC converter connected to an AC system. Power supply 1000 may be configured with a DC/DC converter that converts DC power output from a DC system to a predetermined power.

Power conversion device 2000 is a three-phase inverter connected between power supply 1000 and load 3000 and converts DC power supplied from power supply 1000 to AC power to supply AC power to load 3000. As shown in FIG. 27, power conversion device 2000 includes a main conversion circuit 2010 converting input DC power to AC power for output and a control circuit 2030 outputting a control signal for controlling main conversion circuit 2010 to main conversion circuit 2010.

Load 3000 is a three-phase motor driven by AC power supplied from power conversion device 2000. Load 3000 is not limited to specific applications and is a motor mounted on a variety of electrical equipment, for example, used as a motor for hybrid cars, electric cars, rail vehicles, elevators, or air conditioners.

The detail of power conversion device 2000 will be described below. Main conversion circuit 2010 includes a switching element and a free-wheel diode (not shown), in which the switching element is switched to convert DC power supplied from power supply 1000 to AC power and supply the AC power to load 3000. A variety of circuit configurations can be employed for main conversion circuit 2010. Main conversion circuit 2010 according to the present embodiment is a two-level three-phase full bridge circuit and may include six switching elements and six free-wheel diodes in anti-parallel with the respective switching elements. At least one of the switching elements and the free-wheel diodes of main conversion circuit 2010 is configured with a power module according to any one of the forgoing first to seventh embodiments, that is, a semiconductor module 2020 corresponding to semiconductor component 3, for example. Six switching elements are connected in series two by two to form upper and lower arms, and the upper and lower arms constitute the phases (U phase, V phase, W phase) of the full bridge circuit. The output terminals of the upper and lower arms, that is, three output terminals of main conversion circuit 2010 are connected to load 3000.

Main conversion circuit 2010 also includes a drive circuit (not shown) that drives at least one of the switching elements and the free-wheel diodes (hereinafter referred to as "switching element(s)"). However, the drive circuit may be contained in semiconductor module 2020, or the drive circuit may be provided separately from semiconductor module 2020. The drive circuit generates a drive signal for driving a switching element of main conversion circuit 2010 and supplies the drive signal to the control electrode of the switching element of main conversion circuit 2010. Specifically, in accordance with a control signal from control circuit 2030 described later, a drive signal for turning on a switching element and a drive signal for turning off a switching element are output to the control electrodes of the switching elements. When the switching element is kept on, the drive signal is a voltage signal (ON signal) equal to or higher than a threshold voltage of the switching element, whereas when the switching element is kept off, the drive signal is a voltage signal (OFF signal) equal to or lower than a threshold voltage of the switching element.

Control circuit 2030 controls a switching element of main conversion circuit 2010 such that a desired power is supplied to load 3000. Specifically, the time (ON time) during which each switching element of main conversion circuit 2010 is to be in the ON state is calculated, based on power to be supplied to load 3000. For example, main conversion circuit 2010 can be controlled by PWM control that modulates the ON time of a switching element in accordance with the voltage to be output. At each point of time, a control command (control signal) is output to the drive circuit in main conversion circuit 2010 such that an ON signal is output to a switching element to be turned on, and an OFF signal is output to a switching element to be turned off. The drive circuit outputs an ON signal or an OFF signal as a drive signal to the control electrode of each switching element, in accordance with the control signal.

In the power conversion device according to the present embodiment, the power module of the circuit device according to the first to seventh embodiments is applied as a switching element and a free-wheel diode of main conversion circuit 2010. This configuration can achieve the operation effects such as improvement in cooling efficiency as described above.

In the present embodiment, the present invention is applied to a two-level three-phase converter. However, the present invention is not limited thereto and can be applied to a variety of power conversion devices. In the present embodiment, a two-level power conversion device is employed. However, a three-level or multilevel power conversion device may be employed. When power is supplied to a single-phase load, the present invention can be applied to a single-phase inverter. When power is supplied, for example, to a DC load, the present invention can be applied to a DC/DC converter or an AC/DC converter.

The power conversion device to which the present invention is applied is not limited to the foregoing case where the load is a motor and can be used as a power supply device for, for example, an electric discharge machine, a laser processing machine, an induction heating cooker, or a contactless power transfer system, or can be used as a power conditioner for a solar power generation system or a power storage system.

The features illustrated in the foregoing embodiments (and examples included therein) can be applied in combination as appropriate so as to be technically consistent.

The embodiments disclosed here should be understood as being illustrative in all respects and should not be construed as being limitative. The scope of the present invention is shown not in the foregoing description but in the claims, and it is intended that all modifications that come within the meaning and range of equivalence to the claims are embraced here.

REFERENCE SIGNS LIST

1A1, 1A2, 1A3, 1A4, 1A5, 1B1, 1B2, 1B3, 1B4, 1C, 1D, 1E, 1F, 1G circuit device, 2 printed circuit board, 2A one main surface, 2B the other main surface, 2E end surface, 3 semiconductor component, 4 electronic component, 5, 5A, 5B metal spacer, 5A1 flat tube, 5A2, 5A3, 5A4, 5A5, 5A6 square tube, 5A7, 5A8 metal flat plate, 5A9 corrugated metal plate, 5A10 comb-shaped portion, 5A11 split portion, 5C hollow portion, 5D spacer through hole, 6, 6A, 6B cooler, 6C protrusion, 6D cooler connecting portion, 7 solder layer, 8 resin layer, 9 magnetic component, 10 cut portion, 20 photoresist layer, 21, 21A, 21B, 21C, 21D, 21E conductor layer, 22, 22A, 22B, 22C insulating layer, 23 through hole, 24 coil pattern, 25, 35 region, 31 semiconductor device, 32 base plate, 33 resin package, 34 lead frame, 1000 power supply, 2000 power conversion device, 2010 main conversion circuit, 2020 semiconductor module, 2030 control circuit, 3000 load.

The invention claimed is:

1. A circuit device, comprising:
   a printed circuit board having a first main surface and a second main surface;
   a mounted component at least partially disposed on at least one of the first main surface and the second main surface of the printed circuit board;
   a metal spacer disposed on at least one of the first main surface and the second main surface of the printed circuit board;
   a cooler disposed at the metal spacer on an opposite side to the printed circuit board; and
   a resin layer disposed between the metal spacer and the cooler,
   wherein the metal spacer has a shape so that at least one hollow portion is formed between the printed circuit board and the cooler, and
   the cooler and the metal spacer are electrically insulated from each other.

2. The circuit device according to claim 1, wherein the metal spacer has a thickness equal to or larger than the mounted component with respect to a direction intersecting the first and second main surfaces.

3. The circuit device according to claim 1, wherein
   the printed circuit board includes a conductor layer along at least one of the first and second main surfaces,
   the metal spacer is bonded to the conductor layer by a first bonding material, and
   the first bonding material has a melting point lower than a melting point of the metal material forming the metal spacer.

4. The circuit device according to claim 3, wherein the mounted component is connected to the metal spacer by the first bonding material.

5. The circuit device according to claim 3, wherein
   the metal spacer includes a first region having a comb shape and a second region extending from a region two-dimensionally overlapping the first region to a region two-dimensionally overlapping the mounted component, and
   the mounted component is connected to the second region of the metal spacer by a second bonding material.

6. The circuit device according to claim 5, wherein the second bonding material is a material different from the first bonding material.

7. The circuit device according to claim 1, wherein
   the metal spacer includes a pair of first portions extending in a direction along the main surfaces and disposed at a distance from each other in a longitudinal direction, and a plurality of second portions extending in a region between the pair of first portions from each of the pair of first portions in a direction intersecting the main surfaces, the second portions being disposed at a distance in a width direction from each other with respect to the direction along the main surfaces,
   the metal spacer forms the hollow portion with the distance in the width direction, and
   one of the pair of first portions is bonded to the printed circuit board.

8. The circuit device according to claim 1, wherein
the metal spacer includes a first portion extending in a direction along the main surfaces, and a plurality of second portions extending from the first portion in a direction intersecting the main surfaces, the second portions being disposed at a distance in a width direction from each other with respect to the direction along the main surfaces,
the metal spacer forms the hollow portion with the distance in the width direction, and
the second portions are bonded to the printed circuit board.

9. The circuit device according to claim 8, wherein the mounted component is disposed in the hollow portion.

10. The circuit device according to claim 8, wherein
the metal spacer has a cut portion in which the metal spacer is partially cut out, and
in the cut portion, a part of the metal spacer is bent and bonded to the printed circuit board.

11. The circuit device according to claim 1, wherein the hollow portion extends in a direction along the main surfaces from a region adjacent to the mounted component to a region adjacent to an end surface of the printed circuit board.

12. The circuit device according to claim 1, wherein
the metal spacer includes a first metal spacer on the first main surface and a second metal spacer on the second main surface on an opposite side to the first main surface, and
the cooler includes a first cooler on the first main surface and a second cooler on the second main surface.

13. The circuit device according to claim 12, wherein
the cooler further includes a cooler connecting portion extending in a direction intersecting the first main surface so as to connect an end portion of the first cooler to an end portion of the second cooler, and
the hollow portion extends in a direction along the first main surface from a region adjacent to the mounted component to a region adjacent to the cooler connecting portion.

14. The circuit device according to claim 1, wherein
the mounted component is a magnetic component, and
the magnetic component extends from above the one main surface to pass through interior of the printed circuit board.

15. The circuit device according to claim 1, wherein the at least one hollow portion is a plurality of hollow portions extending in a columnar shape and spaced apart from each other with respect to a direction along the main surfaces.

16. A power conversion device including the circuit device according to claim 1,
the power conversion device comprising:
a main conversion circuit having a semiconductor module included in the circuit device to convert input power and output the converted power; and
a control circuit to output a control signal for controlling the main conversion circuit to the main conversion circuit.

* * * * *